United States Patent
Wang et al.

(10) Patent No.: US 9,880,061 B2
(45) Date of Patent: Jan. 30, 2018

(54) METHODS AND APPARATUS FOR SENSING THE INTERNAL TEMPERATURE OF AN ELECTROCHEMICAL DEVICE

(71) Applicant: HRL Laboratories, LLC, Malibu, CA (US)

(72) Inventors: John Wang, Los Angeles, CA (US); Shuoqin Wang, Oak Park, CA (US); Souren Soukiazian, Glendale, CA (US); Jason A. Graetz, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 812 days.

(21) Appl. No.: 14/303,132

(22) Filed: Jun. 12, 2014

(65) Prior Publication Data
US 2014/0372055 A1    Dec. 18, 2014

Related U.S. Application Data

(60) Provisional application No. 61/834,933, filed on Jun. 14, 2013, provisional application No. 61/834,906, filed on Jun. 14, 2013.

(51) Int. Cl.
*G01R 21/00* (2006.01)
*G01K 13/00* (2006.01)
(Continued)

(52) U.S. Cl.
CPC .............. *G01K 13/00* (2013.01); *G01K 7/427* (2013.01); *G01R 31/3624* (2013.01);
(Continued)

(58) Field of Classification Search
CPC ................ G01K 13/00; G01R 31/3624; G01R 31/3662; G01R 31/3651; G01R 31/3606
(Continued)

(56) References Cited

U.S. PATENT DOCUMENTS 5,280,424 A * 1/1994 Rony ............... B01J 19/0006
422/108
5,633,801 A    5/1997 Bottman
(Continued)

OTHER PUBLICATIONS

Andre et al, "Characterization of high-power lithium-ion batteries by electrochemical impedance spectroscopy. I. Experimental investigation", Jan. 2011, Journal of Power Sources 196 (2011) 5334-5341.*

(Continued)

*Primary Examiner* — Stephanie Bloss
(74) *Attorney, Agent, or Firm* — O'Connor & Company

(57) ABSTRACT

The internal temperature of an electrochemical device may be probed without a thermocouple, infrared detector, or other auxiliary device to measure temperature. Some methods include exciting an electrochemical device with a driving profile; acquiring voltage and current data from the electrochemical device, in response to the driving profile; calculating an impulse response from the current and voltage data; calculating an impedance spectrum of the electrochemical device from the impulse response; calculating a state-of-charge of the electrochemical device; and then estimating internal temperature of the electrochemical device based on a temperature-impedance-state-of-charge relationship. The electrochemical device may be a battery, fuel cell, electrolytic cell, or capacitor, for example. The procedure is useful for on-line applications which benefit from real-time temperature sensing capabilities during operations. These methods may be readily implemented as part of a device management and safety system.

24 Claims, 18 Drawing Sheets

(51) Int. Cl.
*G01R 31/36* (2006.01)
*G01K 7/42* (2006.01)
(52) U.S. Cl.
CPC ...... *G01R 31/3662* (2013.01); *G01R 31/3606* (2013.01); *G01R 31/3651* (2013.01)
(58) Field of Classification Search
USPC .................................................. 702/60, 63
See application file for complete search history.

(56) References Cited

U.S. PATENT DOCUMENTS

| 5,914,605 | A | * | 6/1999 | Bertness | G01R 31/36 |
| | | | | | 320/161 |
| 6,137,269 | A | | 10/2000 | Champlin | |
| 6,294,897 | B1 | | 9/2001 | Champlin | |
| 6,339,334 | B1 | * | 1/2002 | Park | G01N 27/416 |
| | | | | | 324/425 |
| 7,015,701 | B2 | | 3/2006 | Wiegand | |
| 7,504,835 | B2 | | 3/2009 | Byington et al. | |
| 2011/0060538 | A1 | * | 3/2011 | Fahimi | G01R 31/3679 |
| | | | | | 702/63 |
| 2012/0099618 | A1 | * | 4/2012 | Nishi | G01K 7/42 |
| | | | | | 374/152 |
| 2012/0303208 | A1 | | 11/2012 | Hariharan | |
| 2013/0193998 | A1 | * | 8/2013 | Tang | G01R 31/14 |
| | | | | | 324/764.01 |

OTHER PUBLICATIONS

Xiao et al., "A universal state-of-charge algorithm for batteries," 47th IEEE Design Automation Conference, Anaheim, CA, 2010.
Wang et al., "Multi-parameter battery state estimator based on the adaptive and direct solution of the governing differential equations" Journal of Power Sources 196 (2011) 8735-8741.
Kiani, "Online Detection of Faulty Battery Cells in Energy Storage Systems Via Impulse Response Method" 978-1-61284-247-9/11 2011 IEEE.
Mochalov and Kolosnitsyn, "A Pulsed Fourier Spectrometer for Impedance Measurements of Electrochemical Systems", Instruments and Experimental Techniques, Vol. 43, No. 1, 2000, pp. 53-56.
Dinh Vinh Do et al., "Impedance Observer for a Li-Ion Battery Using Kalman Filter", IEEE Transactions on Vehicular Technology, Vo. 58, No. 8, Oct. 2009, 3930-3937.

* cited by examiner

200

METHODS AND APPARATUS FOR SENSING THE INTERNAL TEMPERATURE OF AN ELECTROCHEMICAL DEVICE

PRIORITY DATA

This non-provisional patent application claims priority to U.S. Provisional Patent Application No. 61/834,933, filed Jun. 14, 2013, and to U.S. Provisional Patent Application No. 61/834,906, filed Jun. 14, 2013, each of which is hereby incorporated by reference herein in its entirety.

FIELD OF THE INVENTION

The present invention generally relates to the real-time characterization of electrochemical devices, such as batteries and fuel cells, and in particular to internal temperature estimation in such devices.

BACKGROUND OF THE INVENTION

An electrochemical system is a system that either derives electrical energy from chemical reactions, or facilitates chemical reactions through the introduction of electrical energy. An electrochemical system generally includes a cathode, an anode, and an electrolyte, and is typically complex with multiple heterogeneous subsystems, multiple scales from nanometers to meters. Examples of these systems include fuel cells, batteries, and electroplating systems. On-line characterization of batteries or fuel cells in vehicles is difficult, due to very rough noisy environments.

On-line characterization of such electrochemical systems is desirable in many applications, which include real-time evaluation of in-flight batteries on a satellite or aviation vehicle, and dynamic diagnostics of traction batteries for electric and hybrid-electric vehicles. In many battery-powered systems, the efficiency of batteries can be greatly enhanced by intelligent management of the electrochemical energy storage system. Management is only possible with proper diagnosis of the battery states.

Although there may be many kinds of characterization models for an electrochemical system, equivalent circuit models are most appropriate in many applications where stringent real-time requirements and limiting computing powers need to be considered. An algorithm for a circuit model is relatively simple, meaning that simulation time is short and the computation cost is relatively low. A circuit model is an empirical model that describes the electrochemical system with a resistor-capacitor (or resistor-inductor-capacitor) circuit.

In a suitable circuit model, major effects of thermodynamic and kinetic processes in the electrochemical system can be represented by circuit elements. For example, the electrode potential between the cathode and the anode of a system can be represented with a voltage source, the charge-transfer processes can be represented with charge-transfer resistances, the double-layer adsorption can be represented with capacitances, and mass-transfer or diffusion effects can be represented with resistances such as Warburg resistances. Therefore a circuit model is extremely useful for many on-line diagnostics of the real-time states of an electrochemical system.

Conventionally, a thermocouple is used to measure the temperature of a device or structure, but very often, it is very difficult and troublesome to embed the thermocouples into a system, such as the case of an energy storage device (e.g., lithium-ion batteries). Infrared imaging is another technique for thermal imaging. However, this method not only requires an IR camera, but it is also very difficult to quantify the internal temperature of the battery. The current technologies very often only measure the outside or surface temperatures, which do not reflect what is going on inside a device. It is known that for many batteries such as a secondary Li-ion battery, impedances are sensitive to their own inner temperatures (see, for example, US2012/0099618).

Monitoring the internal temperature of a battery is critical for battery testing/evaluations, efficient battery management, and safety. Conventional methods of monitoring the ambient battery temperature or the temperature of a battery's external casing are a poor indication of the internal temperature of the cell. Because the thermal conductivities of the active material layers are less than those of the metals, depending on the heating rate, the internal temperature can vary significantly from the external temperature. This is especially problematic when localized internal heating occurs; poor thermal conductivity of the battery layers can produce large temperature gradients between the internal and external components of the battery.

A system that is capable of monitoring the internal cell temperature could provide safer, more efficient management of batteries and other electrochemical devices. Improvements are desired for more-accurate estimates of internal temperatures in these electrochemical devices.

SUMMARY OF THE INVENTION

The present invention addresses the aforementioned needs in the art, as will now be summarized and then further described in detail below.

In some variations, the invention provides a method of estimating the internal temperature of an electrochemical device, the method comprising:

(a) exciting the electrochemical device with a driving profile;

(b) acquiring voltage and current data from the electrochemical device, in response to the driving profile;

(c) calculating an impulse response from the current and voltage data and time derivatives thereof, optionally using a recursive or matrix-based method;

(d) calculating an impedance spectrum of the electrochemical device from the impulse response using an impulse response model;

(e) calculating a state-of-charge of the electrochemical device; and (f) estimating an internal temperature of the electrochemical device based on a temperature-impedance-state-of-charge relationship characterizing the electrochemical device.

The electrochemical device may be selected from the group consisting of a battery, a fuel cell, an electrolytic cell, a capacitor, a supercapacitor, a pseudocapacitor, an electroplating system, and a galvanic corrosion system. In some embodiments, the electrochemical device is a lithium-ion battery.

When such a method is employed, the electrochemical device need not be configured with a thermocouple, infrared detector, or other auxiliary device to measure temperature. Optionally, the device could be configured with a thermocouple, for example, to initially or occasionally calibrate the device.

The electrochemical device may be excited with various driving profiles. In some embodiments, the driving profile is based on normal operation of the electrochemical device. It can be preferred to select the driving profile in order to obtain the impedance spectrum at a frequency that is known to have a good correlation with temperature. In some embodiments, the driving profile includes constant-current and/or constant-voltage pulses. In certain embodiments, the driving profile includes a plurality of double-pulse sequences, wherein each of the double-pulse sequences comprises a constant-current discharge pulse having a pulse width and a pulse amplitude, a constant-current charge pulse having the pulse width and the pulse amplitude, and a zero-current period. The driving profile may also be random.

In some embodiments, step (c) utilizes a Kalman filtering technique. In some embodiments, the recursive or matrix-based method utilizes a moving window to update time-varying electrical responses. The impulse response model may be a finite impulse response digital filter, an infinite impulse response digital filter, both of these, or some other digital filter or model.

In some embodiments, the impedance spectrum in step (d) is calculated in a frequency range of about 0.01 Hz to about 1000 Hz, such as about 0.1 Hz to about 1 Hz, or about 1 Hz to about 10 Hz, for example.

There are various ways to calculate or estimate the state-of-charge of the device, in step (e) of the method. In some embodiments, step (e) comprises calculating the Fourier transform of the impulse response to obtain the state-of-charge. In these or other embodiments, step (e) comprises calculating the state-of-charge based on an initial open-circuit voltage and Coulomb counting.

In some embodiments of the invention, the temperature-impedance-state-of-charge relationship is predetermined by calibration of the electrochemical device prior to the method. In these or other embodiments, the temperature-impedance-state-of-charge relationship is in the form of an empirical look-up table or graph that is applicable to the electrochemical device. Alternatively, or additionally, the temperature-impedance-state-of-charge relationship may be in the form of a theoretical equation or fundamental correlation of impedance with temperature and state-of-charge.

In some embodiments, the method is implemented in a temperature sensor within a normal device operation temperature range selected from −30° C. to 60° C. (such as a temperature range of 0-60° C.). In some embodiments, the method is implemented in a temperature safety device within a temperature range selected from −30° C. to 120° C. to detect thermal runaway (such as a temperature range of −30° C. to 120° C. or a range of 20-100° C.).

The method steps (a)-(f) may be repeated any number of times, continually or periodically, during operation of the electrochemical device in order to monitor its internal temperature.

Some variations of the invention also provide a temperature-sensing apparatus for estimating the internal temperature of an electrochemical device, the apparatus comprising a computer that is electrically linkable to the electrochemical device; the computer programmed using non-transitory memory with executable code for executing the steps of:

(a) exciting the electrochemical device with a driving profile;

(b) acquiring voltage and current data from the electrochemical device, in response to the driving profile;

(c) calculating an impulse response from the current and voltage data and time derivatives thereof, using a recursive or matrix-based method;

(d) calculating an impedance spectrum of the electrochemical device from the impulse response using an impulse response model;

(e) calculating a state-of-charge of the electrochemical device; and (f) estimating an internal temperature of the electrochemical device based on a temperature-impedance-state-of-charge relationship characterizing the electrochemical device.

Some variations provide a temperature-monitored electrochemical system comprising a temperature-sensing apparatus that is electrically linked to an electrochemical device, wherein the temperature-sensing apparatus comprises a computer programmed using non-transitory memory with code for executing the steps of:

(a) exciting the electrochemical device with a driving profile;

(b) acquiring voltage and current data from the electrochemical device, in response to the driving profile;

(c) calculating an impulse response from the current and voltage data and time derivatives thereof, optionally using a recursive or matrix-based method;

(d) calculating an impedance spectrum of the electrochemical device from the impulse response using an impulse response model;

(e) calculating a state-of-charge of the electrochemical device; and (f) estimating an internal temperature of the electrochemical device based on a temperature-impedance-state-of-charge relationship characterizing the electrochemical device.

In some embodiments, the system does not include a thermocouple, infrared detector, or other auxiliary device to measure temperature. The electrochemical device may be selected from the group consisting of a battery (e.g., a lithium-ion battery), a fuel cell, an electrolytic cell, a capacitor, a supercapacitor, a pseudocapacitor, an electroplating system, and a galvanic corrosion system.

In some embodiments, the driving profile includes constant-current and/or constant-voltage pulses. In certain embodiments, the driving profile includes a plurality of double-pulse sequences, wherein each of the double-pulse sequences comprises a constant-current discharge pulse having a pulse width and a pulse amplitude, a constant-current charge pulse having the pulse width and the pulse amplitude, and a zero-current period.

In some embodiments, executable step (c) utilizes a recursive or matrix-based Kalman filtering technique. In some embodiments, the recursive or matrix-based method utilizes a moving window to update time-varying electrical responses. The impulse response model may be a finite impulse response digital filter or an infinite impulse response digital filter, for example.

In some embodiments, the impedance spectrum in executable step (d) is estimated in a frequency range of about 0.01 Hz to about 1000 Hz, such as about 0.1 Hz to about 1 Hz.

In some embodiments, step (e) comprises calculating the Fourier transform of the impulse response to obtain the state-of-charge. In these or other embodiments, step (e) comprises calculating the state-of-charge based on an initial open-circuit voltage and Coulomb counting.

In some embodiments of the temperature-monitored electrochemical system the temperature-impedance-state-of-charge relationship is in the form of an empirical look-up table or graph that is applicable to the electrochemical device (such as by calibration of the particular device or the applicable type of device). In these or other embodiments, the temperature-impedance-state-of-charge relationship is in the form of a theoretical equation or fundamental correlation of impedance with temperature and state-of-charge.

In some embodiments, the temperature-sensing apparatus is a temperature sensor within a normal device operation temperature range selected from −30° C. to 60° C. (including any intermediate range of temperatures). In these or other embodiments, the temperature-sensing apparatus is a temperature safety device within a temperature range selected from −30° C. to 120° C. to detect thermal runaway (including any intermediate range of temperatures).

DETAILED DESCRIPTION OF EMBODIMENTS OF THE INVENTION

Figure 1:
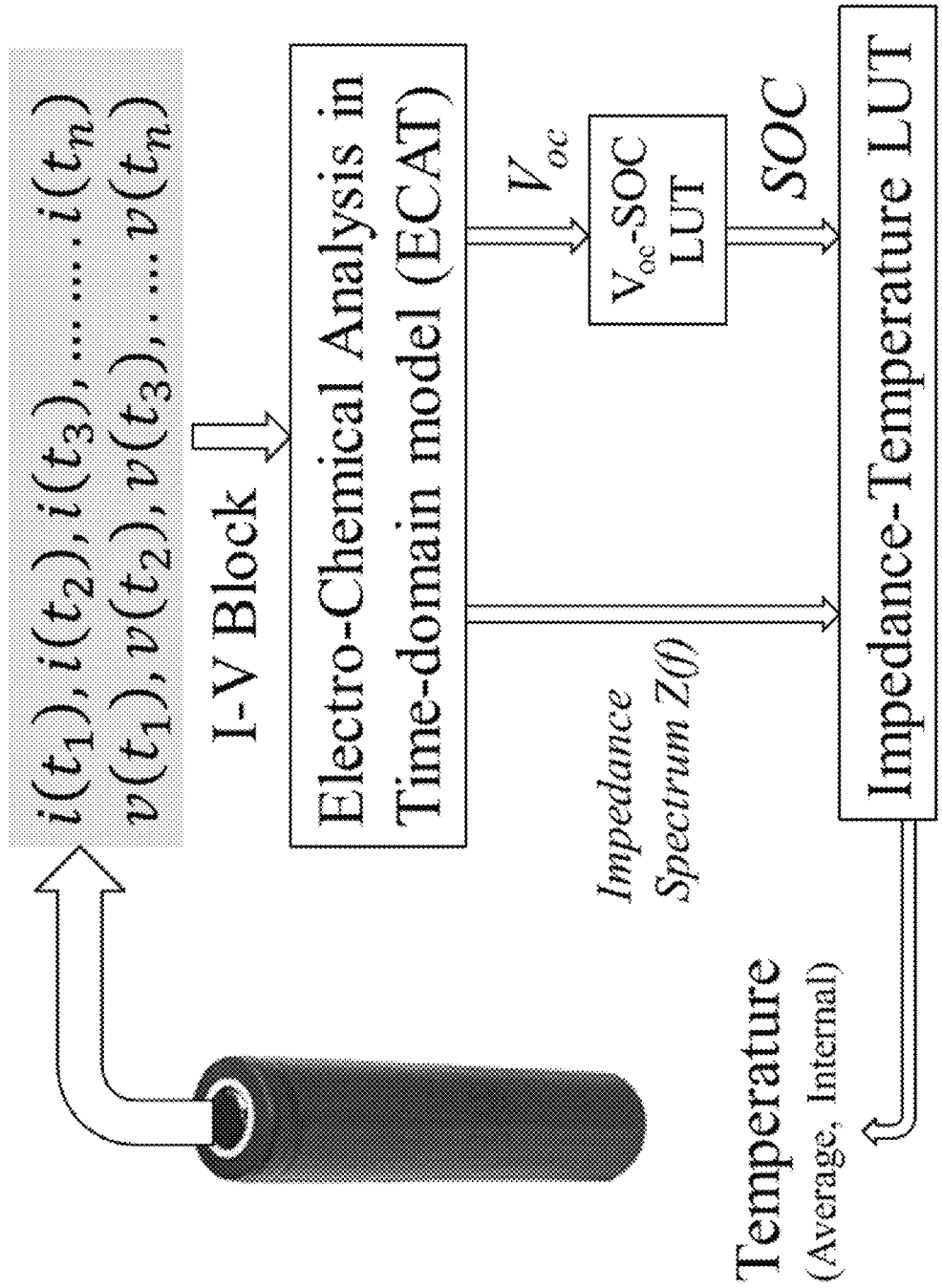
FIG. 1 depicts a flowchart of the methods of the invention, in some embodiments, to estimate the internal temperature.

The methods, apparatus, and systems of the present invention will be described in detail by reference to various non-limiting embodiments and figures.

This description will enable one skilled in the art to make and use the invention, and it describes several embodiments, adaptations, variations, alternatives, and uses of the invention. These and other embodiments, features, and advantages of the present invention will become more apparent to those skilled in the art when taken with reference to the following detailed description of the invention in conjunction with the accompanying drawings.

As used in this specification and the appended claims, the singular forms "a," "an," and "the" include plural referents unless the context clearly indicates otherwise. Unless defined otherwise, all technical and scientific terms used herein have the same meaning as is commonly understood by one of ordinary skill in the art to which this invention belongs.

Unless otherwise indicated, all numbers expressing parameters, conditions, results, and so forth used in the specification and claims are to be understood as being modified in all instances by the term "about." Accordingly, unless indicated to the contrary, the numbers set forth in the following specification and attached claims are approximations that may vary depending upon specific methods and calculations.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phase "consisting essentially of" limits the scope of a claim to the specified elements or method steps, plus those that do not materially affect the basis and novel characteristic(s) of the claimed subject matter.

With respect to the terms "comprising," "consisting of," and "consisting essentially of," where one of these three terms is used herein, the presently disclosed and claimed subject matter may include the use of either of the other two terms. Thus in some embodiments not otherwise explicitly recited, any instance of "comprising" may be replaced by "consisting of" or, alternatively, by "consisting essentially of."

Some variations of the present invention provide an in situ method to probe the internal temperature of a battery from the voltage terminals, without any temperature sensor or auxiliary sensing devices. No auxiliary device is needed because temperature information is extracted from the impedance of a battery, which can be extracted from the current and voltage responses of a battery by the methods described herein.

The disclosed invention is useful for on-line applications which would benefit from real-time temperature sensing capabilities during battery operations, for safety, economics, or any other reasons. These methods may be readily implemented as part of a battery management system.

The principles of the invention may be applied to a variety of electrochemical systems and electrochemical devices, such as (but not limited to) batteries, electrolytic cells, fuel cells, capacitors, electroplating systems. Much of the discussion presented herein is directed to batteries as an example, but the invention should not be so limited.

When the electrochemical system is a battery, an impulse-response-based method enables one to accurately estimate the battery states under dynamic operating conditions. Battery states include, but are not limited to, state-of-health, state-of-charge, state-of-power, high-frequency resistance, charge-transfer resistance, and double-layer capacitance. State-of-health is a figure of merit of the condition of a battery (or a cell, or a battery pack), compared to its ideal conditions. State-of-charge is an indication of how much useful energy remains in the battery. State-of-power characterizes the charge and discharge power capabilities of the battery. High-frequency resistance, charge-transfer resistance, and double-layer capacitance characterize the actual kinetic processes that take place in the battery, including both electrochemical reactions as well as mass transport and diffusion processes.

The Fourier transform of the impulse response represents the impedance spectroscopy. "Impedance spectroscopy" generally refers to signal measurement of the linear electrical response and subsequent analysis of the response to yield useful information about the physicochemical properties of a system. From the impedance spectroscopy, state-of-health, state-of-charge, and state-of-power may be monitored.

Specifically, the impedance at high frequency may be used as an indicator for state-of-health. The reason is that the impedance of typical batteries increases with age. This high-frequency impedance can be directly read out from the spectrum. State-of-charge may be deduced with the open circuit voltage via a voltage-state-of-charge look-up table. The open circuit voltage is a thermodynamic parameter which can be derived if the kinetic response of the system is known. State-of-power is the current response to the maximum/minimum voltage input. Therefore, it can be calculated with the convolution of the voltage and the impulse response.

Some variations provide methods and apparatus to extract the internal temperature from the battery cell impedance or cell resistance. It is known that cell impedance has strong temperature dependence. Once correlations between the cell impedance and temperature are known, temperature information can be extracted from the cell impedance data. The present invention is premised, at least in part, on the realization that the impedance spectrum is also dependent upon not only temperature, but also the battery state-of-charge (SOC). Thus, the disclosed invention also takes into account the effects of SOC to provide a more accurate temperature sensing capability.

In particular, impedances have been found to be sensitive to the battery SOC. The disclosed methods utilize the impedance spectrum (with a frequency range covering approximately 0.01 Hz to 10 Hz, for example) rather than a one-point impedance (e.g., DC impedance) for temperature sensing, taking into account the SOC effect on impedances. These features enhance the method to a more accurate level in device temperature sensing.

Using a secondary battery as an example, the disclosed temperature sensing apparatus calculates the impedance information from the current and voltage responses of a battery. The temperature information is extracted from the impedance data using predetermined impedance-temperature relationships at a given SOC.

As will be described in more detail below, time-varying electrical excitation is applied to a battery. Then time-varying electrical responses (voltage and current) are collected from the battery. An impulse response method is applied to calculate the impedance of a battery using the measured voltage and current signals collected from the electrical excitations. The impulse response method can also extract the SOC information from the electrical excitations. The impulse-response method may be based on direct-current current/voltage pulses or on random device operation protocols, for example. In some embodiments, the impulse-response method is not based on the use of alternating current at a fixed frequency or a narrow frequency range.

In some embodiments, the method for this impulse response includes a high-frequency passing filter, a least-squares method, a moving window to update the time-varying electrical responses, and a predetermined "look-up table" to extract the internal temperature of a battery from the measured impedance data. The look-up table may be in the form of an actual table, a graph or series of graphs, a correlation equation, or other means to capture an empirically determined correlation. The correlation is of impedance as a function of temperature and SOC, so that at a given impedance and SOC, temperature can be estimated. The method, in some embodiments, is illustrated in FIG. 1. Also, the disclosed invention enables the determination of SOC and temperature simultaneously.

By "internal temperature" of an electrochemical device, it is meant the temperature of active materials within the device, rather than a surface temperature. Generally speaking, in a device such as a battery, electrochemical reactions take place at and between electrodes, and there can be a gradient in temperature from the bulk solution (or solid phase) to the surface or interface of the device with a current collector or the environment. The surface or interface temperature is generally easy to monitor, but it does not provide a true picture of what is taking place within the active region. The internal temperature may represent an average temperature across the active region(s), or it may represent the local temperature within one of the electrodes, or some combination of internal temperatures (such as a weighted mean) if there is an internal temperature distribution. In any case, the most valuable representation of internal temperature is what is actually realized (kinetically speaking) by the device and how such electrochemical kinetics are manifested in impedance and SOC. That is the temperature estimated according to this invention.

Some variations of this invention provide an impulse-response-based method for on-line characterization of an electrochemical system. A method as provided herein may utilize measured current (I) and/or voltage (V) signals to directly extract thermodynamic and kinetic information associated with the electrochemical system, dynamically (in real time). The impulse-response-based methods of the present invention can provide high-speed characterization of an electrochemical system with improved accuracy. The methods are robust and suitable for real environment applications under various operating conditions.

The methods work in the time domain without relying on frequency-domain transformations. Therefore, these methods are more aligned for real-time applications. By avoiding frequency-domain transformations, the methods provided herein, in some embodiments, can surprisingly regress the results 1-2 orders of magnitudes faster compared to prior methods.

In addition, the disclosed impulse-response-based methods provide broader capabilities in characterizing an electrochemical system by prescribing an impulse-response function. Circuit models employing conventional circuit elements can have difficulty describing some kinetic processes. In particular, the methods herein explicitly account for time-domain diffusion phenomena.

Generally speaking, any system having an anode and a cathode; any system that supplies, receives, or is in electrical communication with a current and a voltage source or signal; or any system capable of being characterized utilizing the principles described herein, may be an "electrochemical system" within the intended meaning. Electrochemical systems that may be characterized using these impulse-response-based methods include, but are by no means limited to, batteries, fuel cells, capacitors, ultracapacitors, hybrid combustion-electric systems, and other energy-delivery or energy-storage devices.

Electrochemical systems include not only systems intended to provide energy or store energy, but also systems that utilize electrochemical reactions to carry out chemistry or separations of matter. Such electrochemistry applications include electroplating and galvanic corrosion for carrying out chemical reactions, and electrochemical separators for separations of matter. Electrochemical separators include electrochemical membranes and electrostatic precipitators, for example.

Some variations of the invention provide a method of estimating the internal temperature of an electrochemical device, the method comprising:

(a) exciting the electrochemical device with a driving profile;

(b) acquiring voltage and current data from the electrochemical device, in response to the driving profile;

(c) calculating an impulse response from the current and voltage data and time derivatives thereof, using a recursive or matrix-based method;

(d) calculating an impedance spectrum of the electrochemical device from the impulse response using an impulse response model;

(e) calculating a state-of-charge of the electrochemical device; and (f) estimating an internal temperature of the electrochemical device based on a temperature-impedance-state-of-charge relationship characterizing the electrochemical device.

The electrochemical device may be selected from the group consisting of a battery, a fuel cell, an electrolytic cell, a capacitor, a supercapacitor, a pseudocapacitor, an electroplating system, and a galvanic corrosion system. In some embodiments, the electrochemical device is a lithium-ion battery.

The electrochemical device may be excited with various driving profiles. A "driving profile" as used herein means a time-varying current profile, I(t), that is utilized to excite an electrochemical device by providing current to it at varying amplitudes in time. In some embodiments, the driving profile is based on normal operation of the electrochemical device. It can be preferred to select the driving profile in order to obtain the impedance spectrum at a frequency that is known to have a good correlation with temperature. The driving profile may also be random.

In some embodiments, the driving profile includes constant-current and/or constant-voltage pulses. In certain embodiments, the driving profile includes a plurality of double-pulse sequences, wherein each of the double-pulse sequences comprises a constant-current discharge pulse having a pulse width and a pulse amplitude, a constant-current charge pulse having the pulse width and the pulse amplitude, and a zero-current period. Preferably, the magnitude of constant-current discharge pulse is the same as the magnitude of a constant-current charge pulse, so that integration of current over time is zero. The double pulse is preferably symmetric (i.e. charge and discharge pulses being symmetric to each other, with opposite signs of the magnitude) so that the battery SOC is maintained while additional double pulses can be applied to the system. Additionally, since the kinetics are SOC-dependent, a symmetric double pulse enables more-accurate characterization at constant SOC. A "double-pulse driving profile" is further described in U.S. patent application Ser. No. 14/301,334, filed Jun. 11, 2014, which is hereby incorporated by reference herein.

In some embodiments, step (c) utilizes a Kalman filtering technique. In some embodiments, the recursive or matrix-based method utilizes a moving window to update time-varying electrical responses. The impulse response model may be a finite impulse response digital filter, an infinite impulse response digital filter, both of these, or some other digital filter or model. Some methods that may be employed in various embodiments are further described in U.S. patent application Ser. No. 13/646,663, filed Oct. 6, 2012, which is hereby incorporated by reference herein.

In some embodiments, the impedance spectrum in step (d) is calculated in a frequency range of about 0.01 Hz to about 10 Hz, such as about 0.1 Hz to about 1 Hz. In various embodiments, the impedance spectrum in step (d) is calculated at one or more frequencies of about 0.02, 0.05, 0.1, 0.2, 0.3, 0.4, 0.5, 0.6, 0.7, 0.8, 0.9, 1.0, 1.5, 2.0, 3.0, 4.0, 5.0, 6.0, 7.0, 8.0, or 9.0 Hz. In some embodiments, the impedance spectrum in step (d) is calculated in a frequency range of about 10 Hz to about 1000 Hz, such as about 10 Hz to about 100 Hz. These methods may be adapted to find impedances at the specific frequency or frequencies that have the most significant correlation with temperature.

There are various ways to calculate or estimate the state-of-charge of the device, in step (e) of the method. In some embodiments, step (e) comprises calculating the Fourier transform of the impulse response to obtain the state-of-charge. In these or other embodiments, step (e) comprises calculating the state-of-charge based on an initial open-circuit voltage and Coulomb counting.

In some embodiments of the invention, the temperature-impedance-state-of-charge relationship is predetermined by calibration of the electrochemical device prior to the method. In these or other embodiments, the temperature-impedance-state-of-charge relationship is in the form of an empirical look-up table or graph that is applicable to the electrochemical device. Alternatively, or additionally, the temperature-impedance-state-of-charge relationship may be in the form of a theoretical equation or fundamental correlation of impedance with temperature and state-of-charge.

The method steps (a)-(f) may be repeated any number of times, continually or periodically, during operation of the electrochemical device in order to monitor its internal temperature. In some embodiments, the method is implemented in a temperature sensor within a normal device operation temperature range of −30° C. to 60° C. In some embodiments, the method is implemented in a temperature safety device within a temperature range of −30° C. to 120° C. (or another suitable temperature range of interest) to detect thermal runaway.

When such a method is employed, the electrochemical device need not be configured with a thermocouple, infrared detector, or other auxiliary device to measure temperature. Optionally, the device could be configured with a thermocouple, for example, to initially or occasionally calibrate the device.

Also, in some embodiments, both the internal temperature (provided by the disclosed methods herein), as well as a surface temperature and/or an environmental temperature, are measured. The environmental temperature could be provided by a simple thermometer placed in proximity with the device. Then, the difference between the environmental temperature and the device internal temperature could be tracked, to provide additional information. This may be useful, for example, when there are wide environmental temperature fluctuations (e.g., for aircraft) and when it is desirable to assess the heat-transfer rates into and out of the device, or to evaluate the impact of environmental temperature on device performance and internal temperature.

Similarly, a thermocouple could be configured to monitor the device surface temperature, and the difference between the surface temperature and internal temperature (provided by the disclosed methods herein) could be tracked to provide information regarding heat-transfer rates into and out of the device, for example.

It will also be recognized by a person skilled in the art that an estimation of internal temperature can indirectly provide an estimation of any other system property or parameter that depends, solely or partially, on temperature. The temperature estimates, or a collection of temperature estimates forming a temperature history, may be utilized as inputs into equations or correlations, within a computer or programmable apparatus, to estimate a wide variety of parameters. Such parameters may include, but are not limited to, reaction rates (for battery electrode chemistry), reaction rate constants, equilibrium states of reactions, mass-transfer rates, and material properties (e.g., viscosity, density, diffusivity, and stability).

In order for the model to be robust against noise and be agile enough for real-time use, a method is employed that calculates or estimates an impulse response. In the method, the impulse response of the system is deduced with the current and voltage samples of a battery in a selected time window. A moving-window technique may be employed to update the method recursively. The sizes of the impulse response and the window can be adjusted to accommodate the bandwidth of the kinetic process of the system. Once the impulse repulse is deduced at real time, states of the electrochemical system can be derived based on the impulse repulse.

In some embodiments, the method implements noise-filtering techniques which enable stable regression in the method in the presence of noise (e.g., due to electromagnetic interference). Such noise reduction methods also improve the accuracy and reliability of the regressed parameters. Various types of noise in the current and/or voltage data may be present, including high-frequency noise.

In some embodiments, a high-frequency pass filter is used for filtering out static noise associated with current and voltage measurements. A high-frequency pass filter is an electronic filter that passes high-frequency signals but attenuates signals with frequencies lower than the cutoff frequency. High-frequency pass filtering to remove at least some static noise may be helpful in improving the stability of the method.

In some embodiments, a least-squares regression method is implemented for improving the stability of the method against high-frequency noise. Least-squares regression utilizes methods such as, but not limited to, linear least squares, non-linear least squares, partial least squares, sparse partial least squares, weighted least squares, least squares with penalty function, and combinations thereof.

The linear least-squares fitting technique is a convenient form of linear regression. For non-linear least squares fitting to a number of unknown parameters, linear least squares fitting may be applied iteratively to a linearized form of the function until convergence is achieved. It is also possible to linearize a non-linear function at the outset and still use linear methods for determining fit parameters. If uncertainties are known or estimated, points can be weighted differently in order to give the high-quality points more weight, if desired.

The total voltage response of a circuit can be formulated as the superposition of the zero-state response (ZSR) and the zero-input response (ZIR). The ZSR results only from the external inputs of driving currents of the circuit; the ZIR results only from the initial state of the circuit and not from any external drive. For an electrochemical system such as a battery, the ZIR is the open-circuit voltage (OCV) source if the battery has been open circuit for a sufficient time, ignoring self-discharge, to reach an equilibrium state. The ZSR can be calculated as the convolution of the driving currents with an impulse response characterizing the system.

The equation of a voltage response of an electrochemical system such as a battery can thus be written as:

$$V(t) = OCV(t) + \int_0^\infty I(t-\tau) H(\tau) d\tau \quad (EQ. 1)$$

In EQ. 1, V(t) and I(t) are the measured voltage and current values as a function of time. H(t) is the impulse response. In defining the integration range from 0 to ∞, we have complied with the causality that the real-time response is only caused by the inputs at the current time and the time before.

It is assumed that the impulse response converges to zero after finite time $T_o$, i.e., H(t)=0, as t>$T_o$. It is a reasonable approximation for many electrochemical systems, and EQ. 1 is modified as:

$$V(t) = OCV(t) + \int_0^{T_o} I(t-\tau) H(\tau) d\tau \quad (EQ. 2)$$

Further modification is made by differentiating the two sides of the EQ. 2 with time. Differentiating data is equivalent to high-pass filtering for removing static noise which can improve the stability of the method. Moreover, we assume $$\frac{dV(t)}{dt} >> \frac{dOCV(t)}{dt},$$

which is reasonable as long as there are finite current inputs. The result is EQ. 3:

$$\frac{dV(t)}{dt} = \int_0^{T_o} \frac{dI(t-\tau)}{dt} H(\tau) d\tau \quad (EQ. 3)$$

EQ. 3 is the main equation relied upon to solve the impulse response H(t), in some embodiments. However, EQ. 3 is not an explicit formula for H(t).

The desired impulse response H(t) needs to be obtained by deconvolution from EQ. 3. EQ. 3 can be digitized, since evaluation is carried out at the sampling instants with T as the sampling interval. The digitized formula becomes EQ. 4:

$$[DV] = [DI] \cdot [H] \quad (EQ. 4)$$

with $$[DV] = [V_{N+1} - V_N, V_{N+2} - V_{N+1}, \ldots, V_{N+M} - V_{N+M-1}]^T$$

$$[DI] = \begin{bmatrix} I_{N+1} - I_N & I_N - I_{N-1} & \ldots & I_2 - I_1 \\ I_{N+2} - I_{N+1} & I_{N+1} - I_N & \ldots & I_3 - I_2 \\ \ldots & \ldots & \ldots & \ldots \\ I_{N+M} - I_{N+M-1} & I_{N+M-1} - I_{N+M-2} & \ldots & I_{M+1} - I_M \end{bmatrix}$$

$$[H] = [H_0, H_1, \ldots, H_{N-1}]^T.$$

The subscripts in the EQ. 4 represent the sampling coefficients. In some embodiments, N can be chosen so that N≈$T_0$/T. H(t) is evaluated at t=0, T, 2T, . . . , (N−1)T and it is assumed that H(t)=0 for t≥$T_0$=NT. The sum of N and M defines the size of the temporal window, $\Delta t=(N+M)T$, in which the sampled V(t) and I(t) will be used to fill in the matrices of [DV] and [DI]. In these embodiments the sizes of the matrices [DV], [DI], and [H] are M×1, M×N, and N×1, respectively, which means that M≥N is the necessary condition for the valid solution of H(t).

With respect to EQS. 3 and 4, there is always noise in the V(t) and I(t) data which is not explicitly expressed. In order to improve the stability of the method against such noises, a least-squares method may be utilized to solve [H]. In the form of matrices, the solution is given by EQ. 5:

$$[H]=([DI]^T[DI])^{-1}[DI]^T[DV] \qquad (EQ. 5)$$

A valid solution to EQ. 5 for [H] can be acquired as long as the matrix product $[G]=[DI]^T[DT]$ is nonsingular. The rank of [G] provides an estimate of the number of linearly independent rows or columns of [G], at given points in time. There are a number of ways to compute the rank. In some embodiments, singular value decomposition is employed.

In some embodiments, recursive methods are utilized wherein all information utilized stems from previous time-step calculations and measurements at the present time-steps. Optionally, a moving-window technique may be employed to update the method recursively. The sizes of the impulse response and the window can be adjusted to accommodate the bandwidth of the kinetics of the selected electrochemical system (e.g., a battery or fuel cell).

There are several methods to dictate the adjustment of the size of the sampling window. One method is to adjust the size based on the knowledge of the thermodynamics and kinetics of the electrochemical system. If the system has a more sluggish kinetic response, the window may be increased, and vice versa. The response time is different for different electrochemical systems. Also the response time is generally different for a given system at different times.

Another method dictate the adjustment of the size of the sampling window is based on mathematics. The size of the window can be increased at first, and the result of the impulse response H(t) can be used to compare with the H(t) with the original window size. If H(t) changes significantly, the sampling window size may be increased. If H(t) does not change significantly, the size of the window is deemed to be wide enough.

Due to the limitations of computer storage and constraints of embedded controllers, recursive methods may be preferred, in some embodiments. Using recursive methods, all information that is utilized at a given time-step derives from previous time-step calculations along with measurements at the present time-step. The following equations apply to recursive methods.

From EQ. 5, the recursive form can be derived as EQ. 6:

$$\sum_{i=0}^{N-1} H_i \sum_{j=0}^{M-1} DI_{ji}DI_{ji} = \sum_{j=0}^{M-1} DI_{ji}DV_j \qquad (EQ. 6)$$

where $$DI_{ij} = I_{N+i-j+1} - I_{N+i-j},$$

$$DV_i = V_{N+i+1} - V_{N+i}.$$

Each element of the impulse response [H] can be expressed as $$H_l = \frac{X_l - \sum_{i=0,i \neq l}^{N} H_i Y_{il}}{Z_l} = \frac{\sum_{j=0}^{M-1} DI_{jl}DV_j - \sum_{i=0,i \neq l}^{N} H_i \sum_{j=0}^{M-1} DI_{jl}DI_{ji}}{\sum_{j=0}^{M-1} DI_{jl}^2} \qquad (EQ. 7)$$

The $X_i$, $Y_{ij}$, $Z_i$ with i, j=0, 1, ..., N are updated with the following recursive equations:
For i=1, 2, 3, ..., N−1, $$X_i^t = X_{i-1}^{t-1}$$

$$Y_{iL}^t = Y_{i-1,L-1}^{t-1}$$

$$Y_{Li}^t = Y_{iL}^t, L=1,2,\ldots N$$

$$Z_i^t = Z_{i-1}^{t-1}$$

For i=0, $$X_0^t = X_0^{t-1} + (I_{N+M+1}-I_{N+M})(V_{N+M+1}-V_{N+M}) - (I_{N+1}-I_N)(V_{N+1}-V_N)$$

$$Y_{0L}^t = Y_{0L}^{t-1} + (I_{N+M+1}-I_{N+M})(I_{N+M-L}-V_{N+M-L-1}) - (I_{N+1}-I_N)(V_{N-L+1}-V_{N-L}),$$

$$Y_{L0}^t = Y_{0L}^t$$

$$L=1,2,\ldots N$$

$$Z_0^t = Z_0^{t-1} + (I_{N+M+1}-I_{N+M})^2 - (I_{N+1}-I_N)^2$$

In calculating each $H_i$ (i=0, 1, 2, ..., N−1) at the current time with EQ. 7, the most-updated H elements are used on the right-hand side of the equation.

The above-described methods may be implemented in a suitable physical apparatus. Some variations of the invention provide a temperature-sensing apparatus for estimating the internal temperature of an electrochemical device, the apparatus comprising a computer that is electrically linkable to the electrochemical device; the computer programmed using non-transitory memory with executable code for executing the steps of:

(a) exciting the electrochemical device with a driving profile;

(b) acquiring voltage and current data from the electrochemical device, in response to the driving profile;

(c) calculating an impulse response from the current and voltage data and time derivatives thereof, using a recursive or matrix-based method;

(d) calculating an impedance spectrum of the electrochemical device from the impulse response using an impulse response model;

(e) calculating a state-of-charge of the electrochemical device; and (f) estimating an internal temperature of the electrochemical device based on a temperature-impedance-state-of-charge relationship characterizing the electrochemical device.

Some variations provide a temperature-monitored electrochemical system comprising a temperature-sensing apparatus that is electrically linked to an electrochemical device, wherein the temperature-sensing apparatus comprises a computer programmed using non-transitory memory with code for executing the steps of:

(a) exciting the electrochemical device with a driving profile;

(b) acquiring voltage and current data from the electrochemical device, in response to the driving profile;

(c) calculating an impulse response from the current and voltage data and time derivatives thereof, using a recursive or matrix-based method;

(d) calculating an impedance spectrum of the electrochemical device from the impulse response using an impulse response model;

(e) calculating a state-of-charge of the electrochemical device; and (f) estimating an internal temperature of the electrochemical device based on a temperature-impedance-state-of-charge relationship characterizing the electrochemical device.

In some embodiments, the system does not include a thermocouple, infrared detector, or other auxiliary device to measure temperature. The electrochemical device may be selected from the group consisting of a battery (e.g., a lithium-ion battery), a fuel cell, an electrolytic cell, a capacitor, a supercapacitor, a pseudocapacitor, an electroplating system, and a galvanic corrosion system.

In some embodiments, the driving profile includes constant-current and/or constant-voltage pulses. In certain embodiments, the driving profile includes a plurality of double-pulse sequences, wherein each of the double-pulse sequences comprises a constant-current discharge pulse having a pulse width and a pulse amplitude, a constant-current charge pulse having the pulse width and the pulse amplitude, and a zero-current period.

In some embodiments, executable step (c) utilizes a recursive or matrix-based Kalman filtering technique. In some embodiments, the recursive or matrix-based method utilizes a moving window to update time-varying electrical responses. The impulse response model may be a finite impulse response digital filter or an infinite impulse response digital filter, for example.

In some embodiments, the impedance spectrum in executable step (d) is estimated in a frequency range of about 0.01 Hz to about 1000 Hz, such as about 0.1 Hz to about 1 Hz. In various embodiments, the impedance spectrum in executable step (d) is estimated at frequencies of about 0.01, 0.05, 0.1, 0.5, 1, 2, 5, 10, 20, 50, 100, 200, 500, or 1000 Hz, including any intermediate frequency.

In some embodiments, step (e) comprises calculating the Fourier transform of the impulse response to obtain the state-of-charge. In these or other embodiments, step (e) comprises calculating the state-of-charge based on an initial open-circuit voltage and Coulomb counting.

In some embodiments of the temperature-monitored electrochemical system the temperature-impedance-state-of-charge relationship is in the form of an empirical look-up table or graph that is applicable to the electrochemical device (such as by calibration of the particular device or the applicable type of device). In these or other embodiments, the temperature-impedance-state-of-charge relationship is in the form of a theoretical equation or fundamental correlation of impedance with temperature and state-of-charge.

In some embodiments, the temperature-sensing apparatus is a temperature sensor within a normal device operation temperature range selected from −30° C. to 60° C. In these or other embodiments, the temperature-sensing apparatus is a temperature safety device within a temperature range selected from −30° C. to 120° C. to detect thermal runaway. Within these general ranges, specific temperature ranges may be selected, such as −30° C. to 60° C., −10° C. to 80° C., −15° C. to 100° C., 10° C. to 60° C., and so on. Other temperature ranges for such a temperature sensor or safety device are possible, such as 50-150° C., 40-125° C., 0-120° C., etc.

The "computer" utilized in the apparatus is any programmable computing device, or plurality of devices which may be distributed in time or space, capable of being programmed (such as using C++ programming language) or otherwise caused to execute code for executing the steps of any of the methods or methods described herein. The method may be embedded within a controller.

In some embodiments, the computer has a processor, an area of main memory for executing program code under the direction of the processor, a storage device for storing data and program code and a bus connecting the processor, main memory, and the storage device; the code being stored in the storage device and executing in the main non-transient memory under the direction of the processor, to perform the steps of the methods recited in this description. Optionally, the computer may be configured to exchange data with a network (such as the Internet), and may carry out calculations on remote computers, servers, or via cloud computing.

Figure 2:
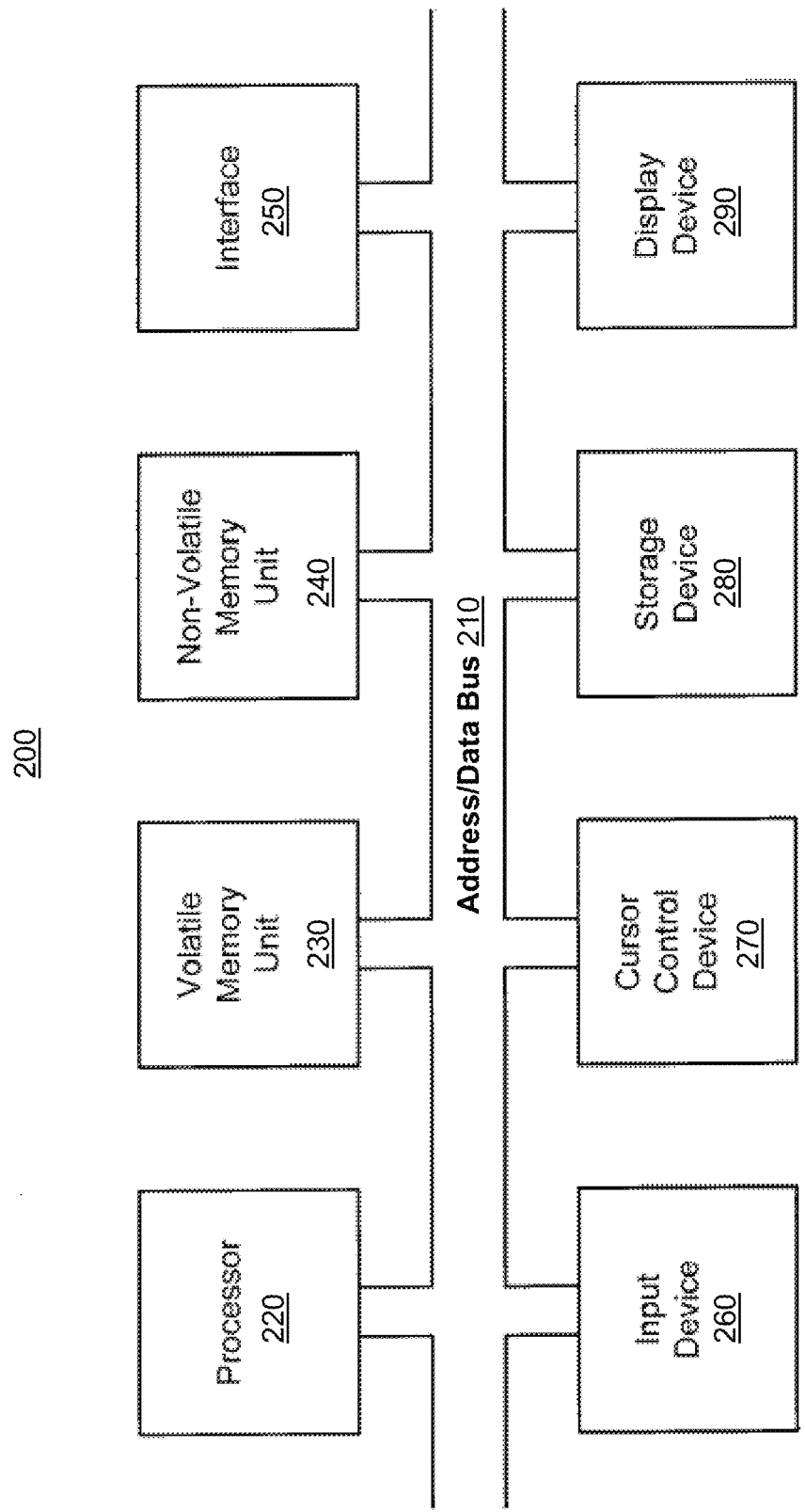
FIG. 2 illustrates an exemplary computer system in accordance with some method and system embodiments.

An exemplary computer system 200 in accordance with some embodiments is shown in FIG. 2. Exemplary computer system 200 is configured to perform calculations, processes, operations, and/or functions associated with a program or method. In some embodiments, certain processes and steps discussed herein are realized as a series of instructions (e.g., software program) that reside within computer-readable memory units and are executed by one or more processors of exemplary computer system 200. When executed, the instructions cause exemplary computer system 200 to perform specific actions and exhibit specific behavior, such as described herein. The computer may be integrated into a management system configured for the device or into an overall system incorporating the device (e.g., an electric vehicle incorporating a battery).

Exemplary computer system 200 may include an address/data bus 210 that is configured to communicate information. Additionally, one or more data processing units, such as processor 220, are coupled with address/data bus 210. Processor 220 is configured to process information and instructions. In some embodiments, processor 220 is a microprocessor. Alternatively, processor 220 may be a different type of processor such as a parallel processor, or a field-programmable gate array.

Exemplary computer system 200 is configured to utilize one or more data-storage units. Exemplary computer system 200 may include a volatile memory unit 230, such as (but not limited to) random access memory ("RAM"), static RAM, or dynamic RAM, etc.) coupled with address/data bus 210, wherein volatile memory unit 230 is configured to store information and instructions for processor 220. Exemplary computer system 200 further may include a non-volatile memory unit 240, such as (but not limited to) read-only memory ("ROM"), programmable ROM ("PROM"), erasable programmable ROM ("EPROM"), electrically erasable programmable ROM "EEPROM"), or flash memory coupled with address/data bus 210, wherein non-volatile memory unit 240 is configured to store static information and instructions for processor 220. Alternatively exemplary computer system 200 may execute instructions retrieved from an online data-storage unit such as in "cloud computing."

In some embodiments, exemplary computer system 200 also may include one or more interfaces, such as interface 250, coupled with address/data bus 210. The one or more interfaces are configured to enable exemplary computer system 200 to interface with other electronic devices and computer systems. The communication interfaces implemented by the one or more interfaces may include wireline (e.g., serial cables, modems, network adaptors, etc.) and/or wireless (e.g., wireless modems, wireless network adaptors, etc.) communication technology.

In some embodiments, exemplar computer system 200 may include an input device 260 coupled with address/data bus 210, wherein input device 260 is configured to communicate information and command selections to processor 220. In accordance with certain embodiments, input device 260 is an alphanumeric input device, such as a keyboard, that may include alphanumeric and/or function keys. Alternatively, input device 260 may be an input device other than an alphanumeric input device. In some embodiments, exemplar computer system 200 may include a cursor control device 270 coupled with address/data bus 210, wherein cursor control device 270 is configured to communicate user input information and/or command selections to processor 220. A cursor control device 270 may be implemented using a device such as a mouse, a track-ball, a track-pad, an optical tracking device, or a touch screen. A cursor control device 270 may alternatively, or additionally, be directed and/or activated via input from input device 260, such as in response to the use of special keys and key sequence commands associated with input device 260. Alternatively, or additionally, cursor control device 270 may be configured to be directed or guided by voice commands.

In some embodiments, exemplary computer system 200 further may include one or more optional computer-usable data-storage devices, such as storage device 280, coupled with address/data bus 210. Storage device 280 is configured to store information and/or computer-executable instructions. In some embodiments, storage device 280 is a storage device such as a magnetic or optical disk drive, including for example a hard disk drive ("HDD"), floppy diskette, compact disk read-only memory ("CD-ROM"), or digital versatile disk ("DVD"). In some embodiments, a display device 290 is coupled with address/data bus 210, wherein display device 290 is configured to display video and/or graphics. Display device 290 may include a cathode ray tube ("CRT"), liquid crystal display ("LCD"), field emission display ("FED"), plasma display or any other display device suitable for displaying video and/or graphic images and alphanumeric characters recognizable to a user.

Exemplary computer system 200 is presented herein as an exemplary computing environment in accordance with some embodiments. However, exemplary computer system 200 is not strictly limited to being a computer system. For example, exemplary computer system 200 may represent a type of data processing analysis that may be used in accordance with various embodiments described herein. Moreover, other computing systems may also be implemented. Indeed, the spirit and scope of the present technology is not limited to any single data processing environment. Thus, in some embodiments, one or more operations of various embodiments are controlled or implemented using computer-executable instructions, such as program modules, being executed by a computer. Such program modules may include routines, programs, objects, components and/or data structures that are configured to perform particular tasks or implement particular abstract data types. In addition, in some embodiments, one or more aspects are implemented by utilizing distributed computing environments, such as where tasks are performed by remote processing devices that are linked through a communications network, or such as where various program modules are located in both local and remote computer-storage media including memory-storage devices.

Still other variations of this invention provide a computer-readable medium containing program instructions for estimating the internal temperature of an electrochemical device, wherein execution of the program instructions by one or more processors of a computer causes the one or more processors to carry out the steps of:

(a) exciting the electrochemical device with a driving profile;

(b) acquiring voltage and current data from the electrochemical device, in response to the driving profile;

(c) calculating an impulse response from the current and voltage data and time derivatives thereof, using a recursive or matrix-based method;

(d) calculating an impedance spectrum of the electrochemical device from the impulse response using an impulse response model;

(e) calculating a state-of-charge of the electrochemical device; and (f) estimating an internal temperature of the electrochemical device based on a temperature-impedance-state-of-charge relationship characterizing the electrochemical device.

The computer-readable medium may be any known medium capable of containing instructions, or computer code, including (but not limited to) hard drives, disks, memory sticks, CDs, DVDs, flash memory devices, and so on. The computer-readable medium may be erasable, non-erasable, encrypted-erasable, etc. The computer-readable medium may then be used within a computer and/or temperature-sensing apparatus that can be electrically or wirelessly linked to an electrochemical device for temperature monitoring.

EXAMPLES

Example 1

Calibration of Impedance Spectrum as a Function of Temperature and State-of-Charge Battery impedance spectrum $Z(f)$ is calibrated as the function of state-of-charge SOC and temperature T. A look-up table (LUT) of Z vs. T at different SOC is then built with the calibration. The procedure for the calibration is as follows.

First, the voltage is floored to the minimum voltage of the battery, and the SOC is regarded as zero. In this Example 1, a Sanyo L333 NiMH cell is used with 1.5 Ah capacity and a voltage range is from 2.8 V to 4.2 V. We discharge the battery until it reaches 2.8 V. A Solartron 1260 is used for the current source. Next, the battery is charged to its 10% SOC, by charging the battery with a C/5 current, i.e. 0.3 A, for half an hour.

Then the battery is placed into a thermal chamber and battery impedance spectrum is measured at different temperatures. The cell is attached with a thermocouple to the surface for temperature monitoring. An impedance spectrometer (Solartron 1255) is used for measuring impedance spectrum. The cell is rested for two hours between the temperatures. These steps are then repeated for four other SOCs: 30%, 50% 70% and 90% in this example (other SOCs may be employed for calibration).

Figure 3:
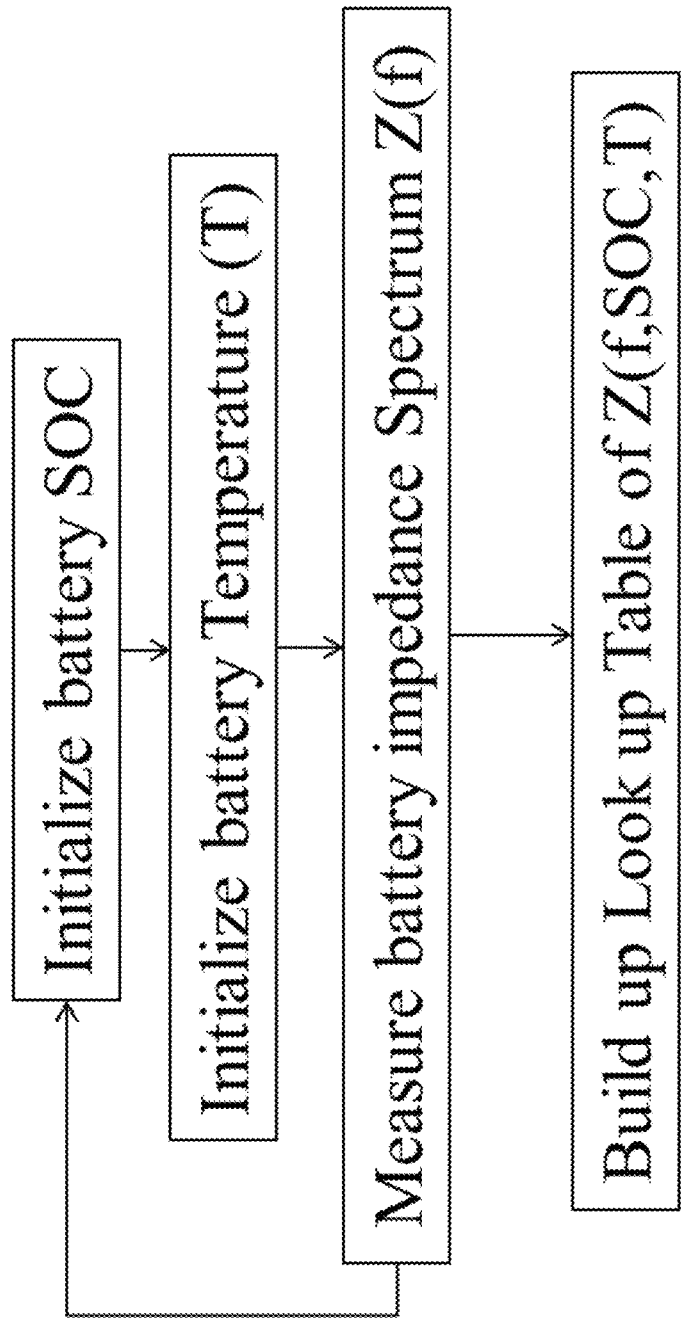
FIG. 3 is a flowchart of a calibration procedure described in Example 1.

Finally a look-up table is constructed of Z vs. T at different SOC, i.e. Z(T, SOC). The flow chart of the calibration is shown in FIG. 3.

Example 2

Demonstration of Estimation of Internal Temperature of a Battery

This example demonstrated how to derive the battery inner temperature just based on the measured battery voltage and current data. First, the battery is initialized and the battery's open circuit voltage is measured with the voltage signal at initial time. Next, the battery is driven with a driving profile and the battery's current and voltage is sampled with a rate of 100 milliseconds (sampling period). The driving profile for this example is a double-pulse driving profile as described above.

The current and voltage data is input into a battery model. From the battery model, we obtain estimates of battery SOC and transfer impedance spectrum. Battery SOC is calculated based on the initial open circuit voltage and Coulomb counting. The battery impedance spectrum is calculated based on the impulse response model as described in this specification.

Figure 4:
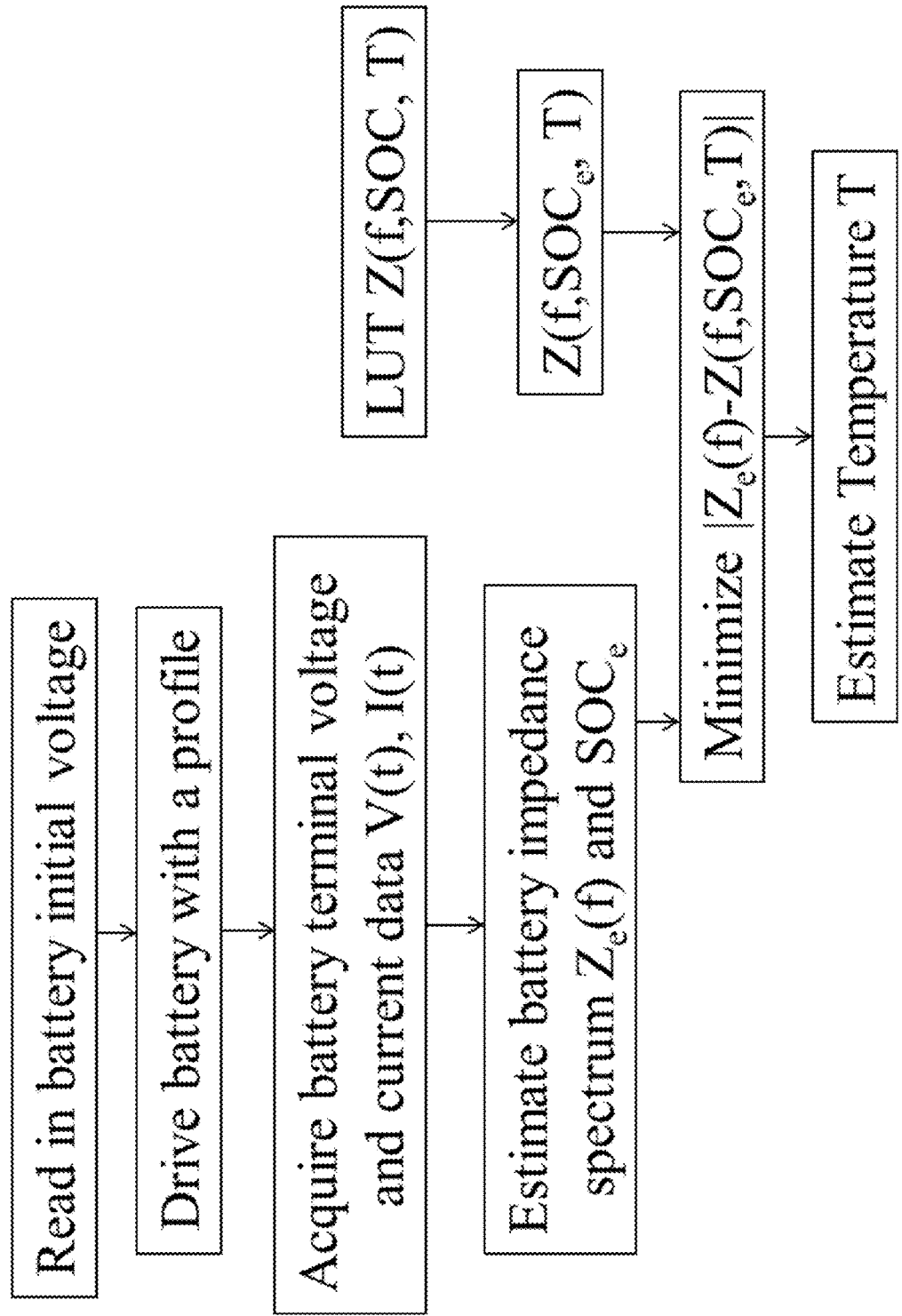
FIG. 4 is a flowchart of a measurement procedure described in Example 2.

Then the battery inner temperature is estimated based on the SOC and the battery spectrum. Specifically, temperature is estimated by minimizing $|\hat{Z}(f)-Z(f,T,\hat{SOC})|$ where $\hat{Z}$ is the calculated impedance from the model and $\hat{SOC}$ is the state-of-charge estimated or calculated from the model. The $Z(f,T,\hat{SOC})$ values are obtained from the look-up table created in the calibration (Example 1). From this minimization, temperature is computed. These steps may be repeated continually to estimate battery temperatures. An exemplary flowchart of the operation is shown in FIG. 4.

Example 3

Demonstration of the Relationship Between the Cell Impedance/Resistance, Temperature, and SOC This information can be used to construct an empirical look-up table so that the temperature and SOC can be quickly determined once the impedance and SOC are known.

A 1.5 Ah, cylindrical commercially available Sanyo cell 18650 is composed of NiCoMn-based composite ($LiMn_{1/3}Ni_{1/3}Co_{1/3}+LiMn_2O_4$) positive electrode and a graphite negative electrode. AC electrochemical impedance spectra (EIS) are acquired with a Solartron Electrochemical Interface 1260 coupled with a Solartron frequency response analyzer 1255. The EIS measurements are carried out in a frequency range between 0.01 to 100 kHz (0.01 to 1 Hz) and an AC amplitude of 0.5 mV.

Figure 5:
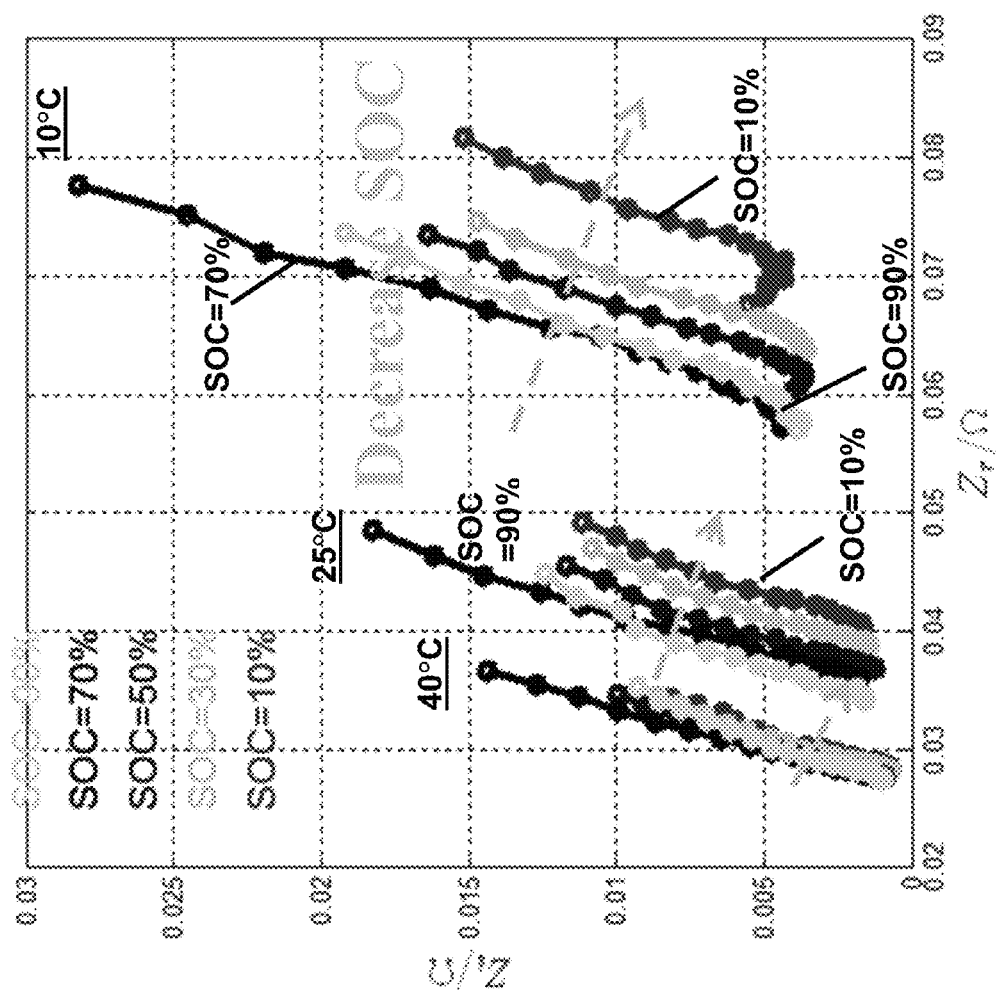
FIG. 5 is a graph of impedance spectra for a cell tested in Example 3 at different SOC (10%, 30%, 50%, 70%, and 90%) and various temperatures (10° C., 25° C., and 40° C.).

FIG. 5 shows impedance spectra from the cell tested at different SOC (10%, 30%, 50%, 70%, and 90%) and various temperatures (10° C., 25° C., and 40° C.). Note that in FIG. 5, each temperature label applies to five curves of varying SOC, i.e. there are three sets of impedance spectra for 10° C., 25° C., and 40° C. The figure demonstrates that the impedance spectrum of the battery has strong temperature dependence. It also indicates that the impedance increases with decreasing SOC. Therefore, building a two-parameter (temperature and SOC) look-up table is important to accurately assess the temperature.

Figure 6:
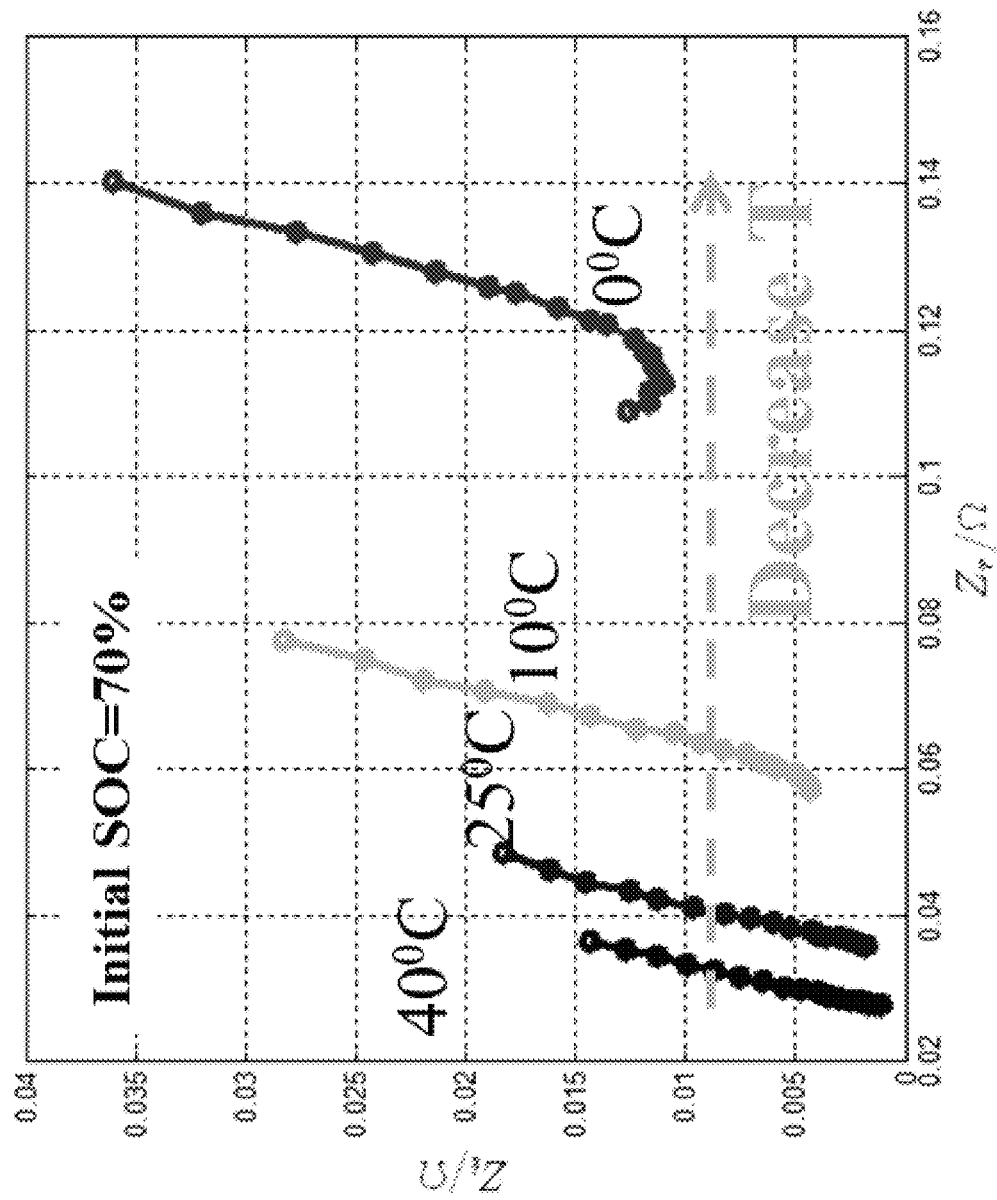
FIG. 6 is a graph of temperature-dependent impedance spectra (Nyquist plot) of a cell measured at different temperatures (0° C., 10° C., 25° C., and 40° C.) at a fixed state-of-charge of 70%, in Example 3.

FIG. 6 shows temperature-dependent impedance spectra (Nyquist plot) of the cell measured at different temperatures (0° C., 10° C., 25° C., and 40° C.) at a fixed state-of-charge of 70%. The figure demonstrates that at a fixed SOC, the impedance spectrum of a battery exhibits clear temperature dependence. As the temperature decreases, the impedance of the battery increases and the trend is monotonic in nature.

Figure 7:
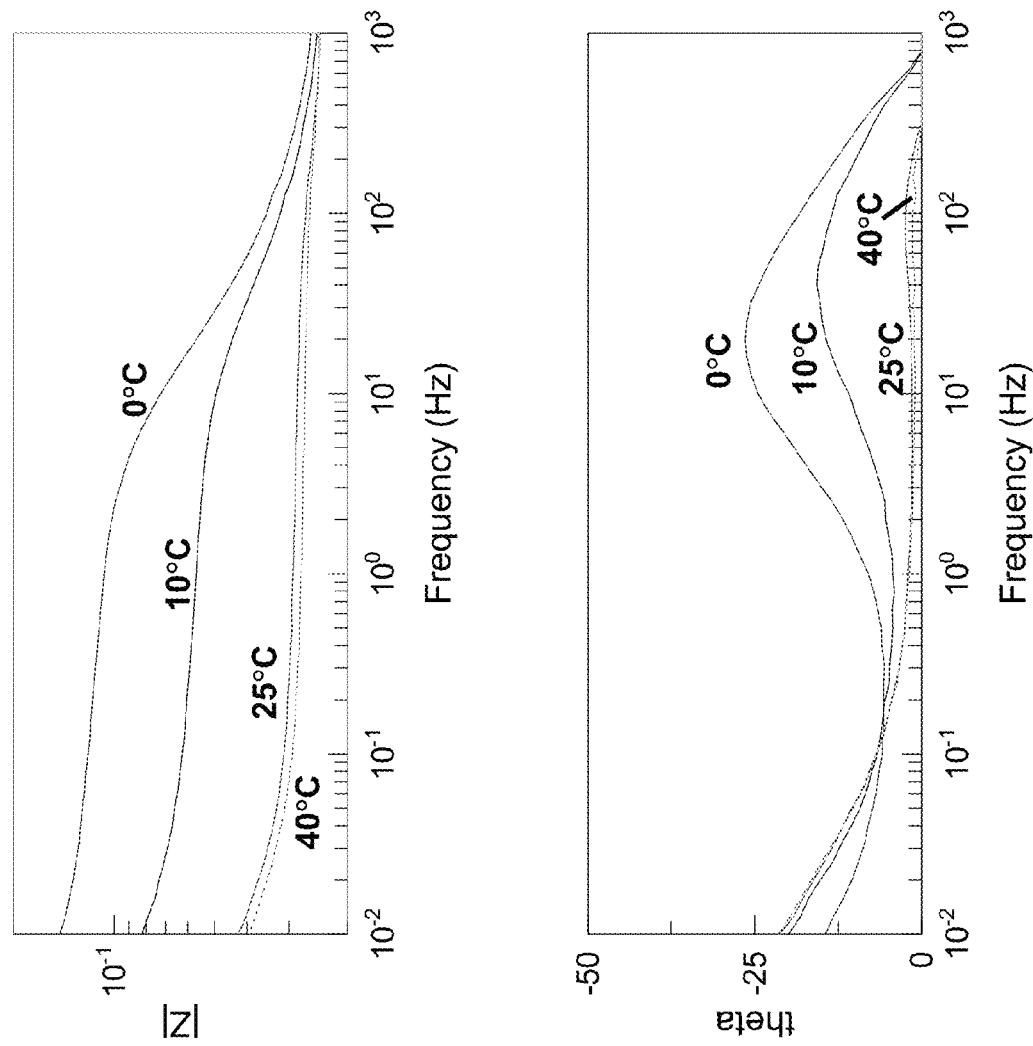
FIG. 7 is a Bode plot of FIG. 6 to illustrate the impedance and phase angle as a function of frequency at different temperatures.
Figure 8:
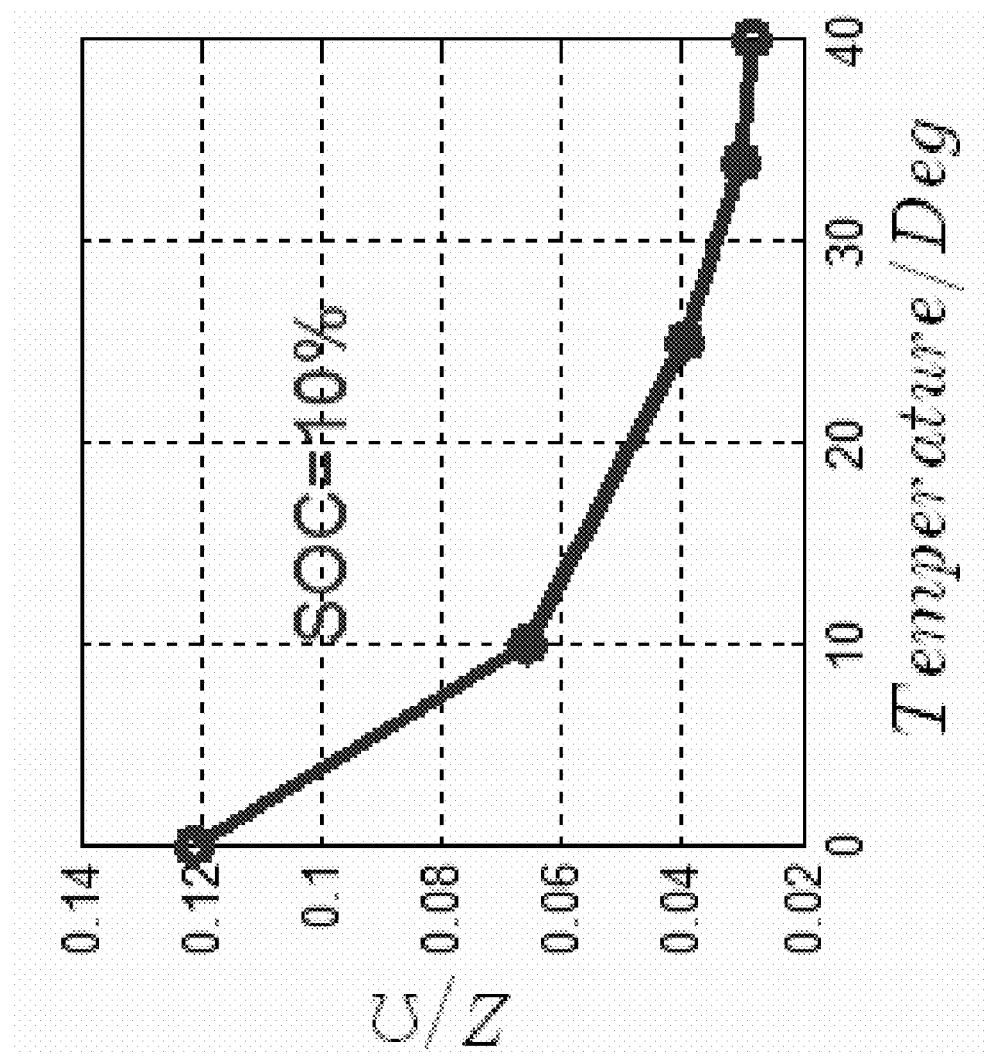
FIGS. 8-11 are series of resistance-temperature relationships for a cell at different SOC (10% in FIG. 8, 30% in FIG. 9, 50% in FIG. 10, 70% in FIG. 11) at 1 Hz, to construct a look-up table (Example 3).
Figure 9:
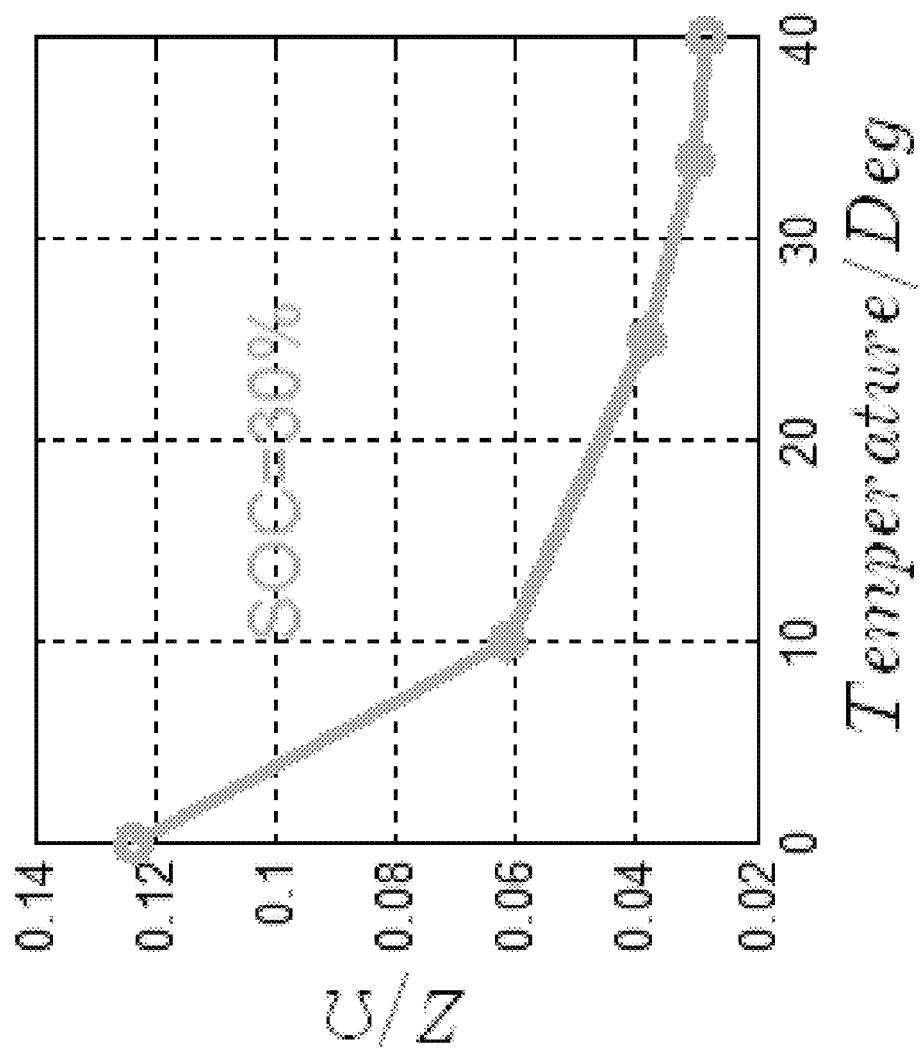
Figure 10:
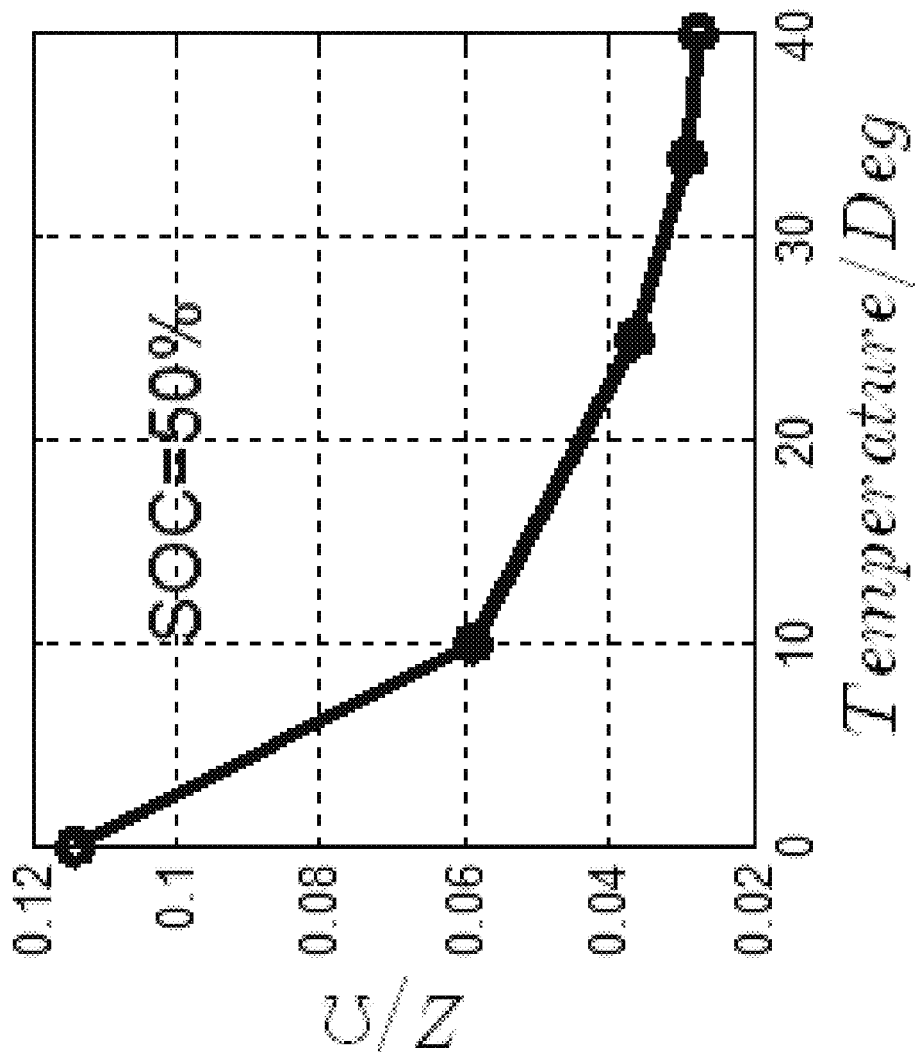
Figure 11:
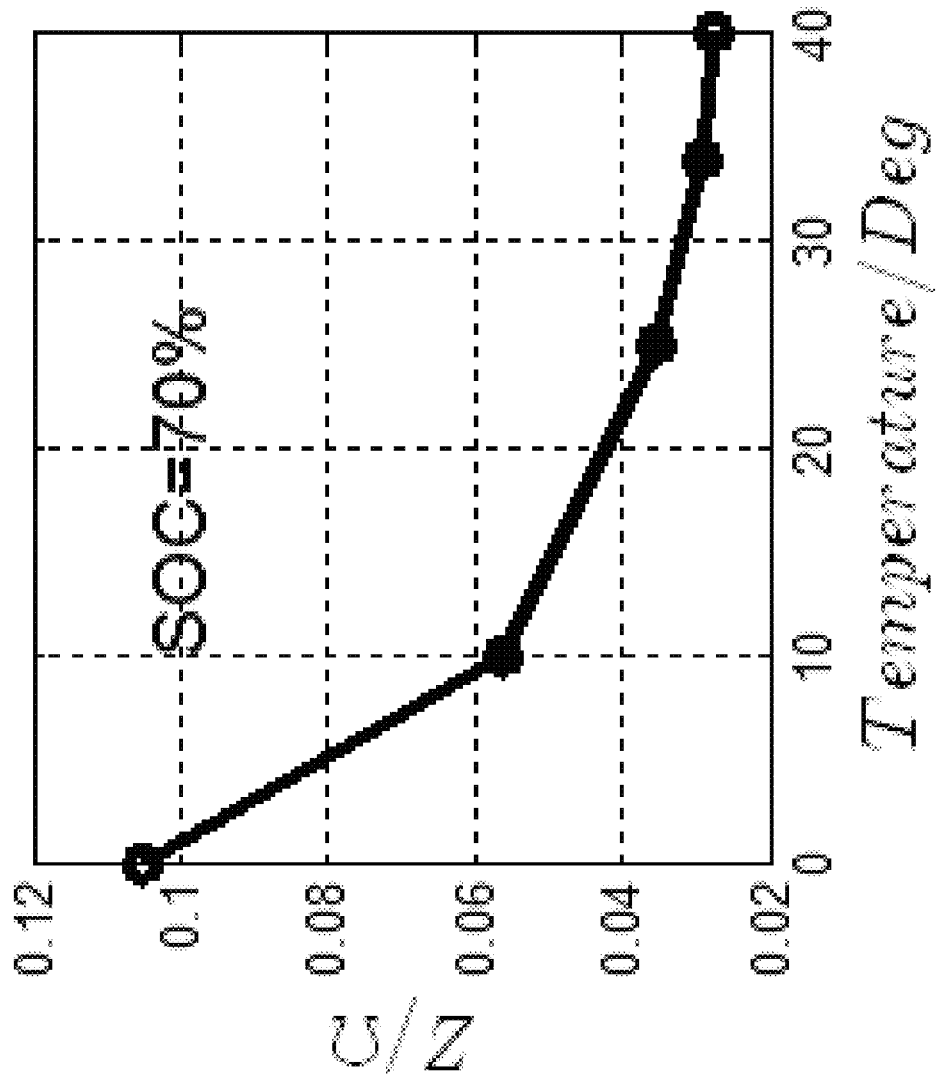

FIG. 7 shows a Bode plot of FIG. 6A to illustrate the impedance and phase angle as a function of frequency at different temperatures. Within a frequency range of 0.1 to 1 Hz, the capacitance contribution is minimal (phase angle is close to 0). This is a preferred frequency range for probing the cell resistance.

FIGS. 8-11 show the resistance-temperature relationship for a cell at different SOC (10% in FIG. 8, 30% in FIG. 9, 50% in FIG. 10, 70% in FIG. 11) at 1 Hz. These data can be used to construct a look-up table. Once the resistance of a cell is known, the temperature of the cell can be extracted from the predetermined resistance-temperature information shown here.

Example 4

Demonstration that the DC (Current/Voltage) Pulse Method can be Used to Obtain Resistance/Impedance Data This is a preferred method for on-board applications where AC impedance measurements are not available.

Figure 12:
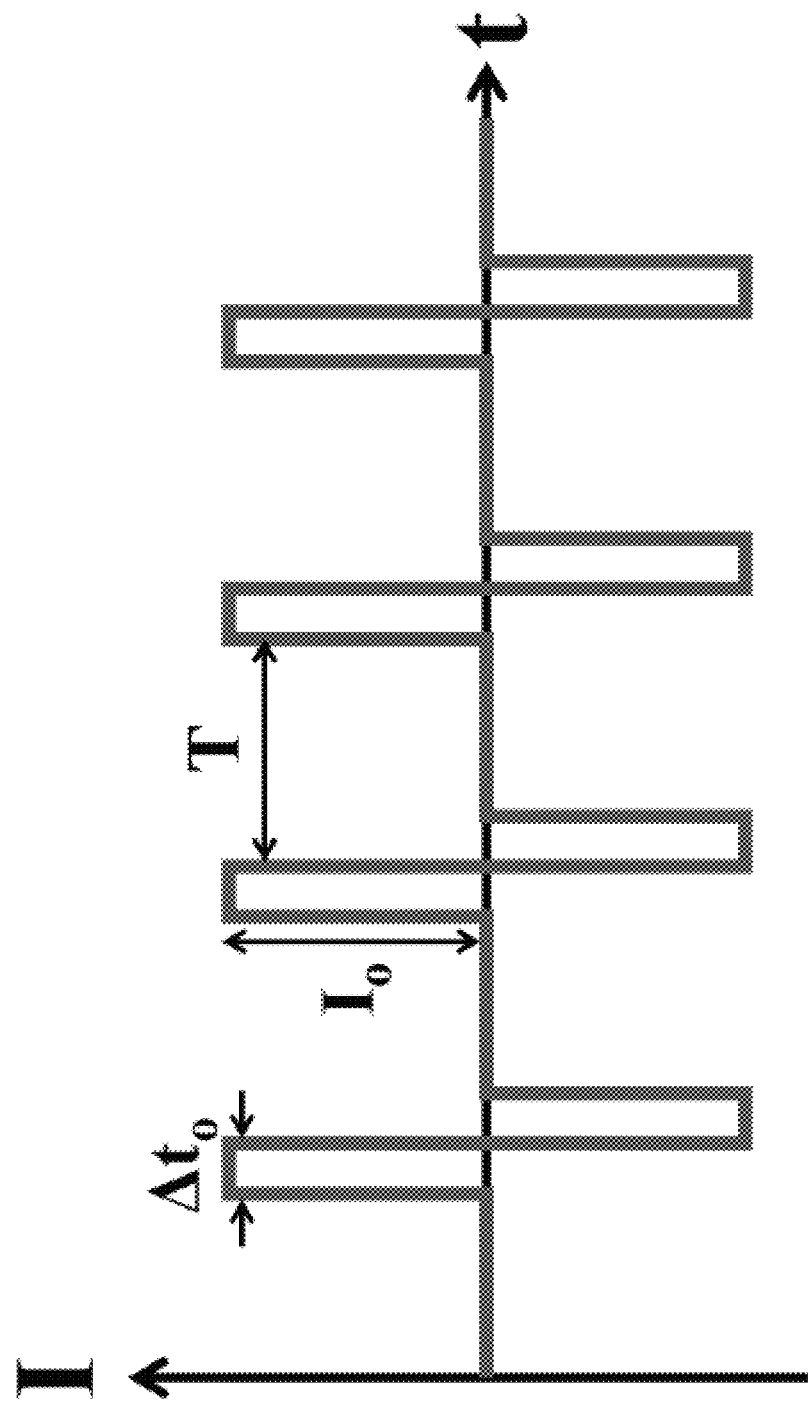
FIG. 12 is a depiction of a current pulse used to probe the impedance and SOC of a cell, in some embodiments of the invention (and in Example 4).

FIG. 12 shows a current pulse used to probe the impedance and SOC of a cell. The amplitude $I_0$ of the current is typically in the range of 1C to 5C. 1C is the current require to charge (or discharge) the cell in 1 hr (for example, if the battery is 5 Ah, then the 1C rate current means 5 A, and 5C means 25 A). The duration of the charge/discharge pulses ($\Delta t_0$) is typically chosen to correlate with the frequency range of interest; the pulse used here is 10 s. The interval T between the two pulses determines the relaxation time of the terminal voltage to the open circuit voltage; the interval used here is 100 s.

Figure 13:
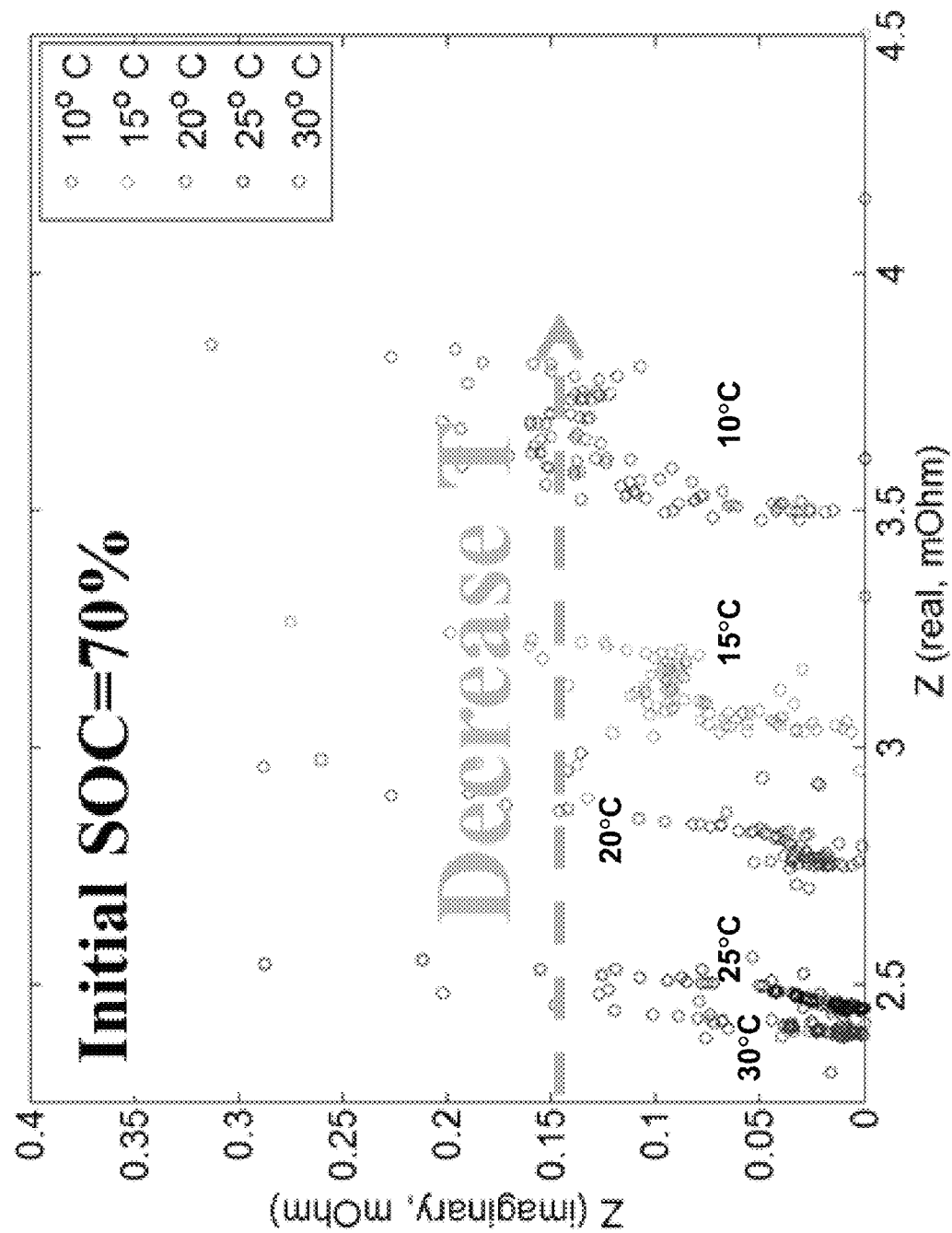
FIG. 13 is a graph of the impedance spectra (Nyquist plots) at five different temperatures with the same initial SOC (70%).

FIG. 13 shows impedance spectra determined using the impulse response method (DC pulse) using a Hitachi 2nd generation battery (Hitachi Automotive Products, #A23-06H040G06, 5.6 Ah, cylindrically packed, $LiMn_{1/3}Ni_{1/3}Co_{1/3}$). The current profile depicted in FIG. 12 is used as a driving profile to drive the battery.

Experiments are conducted at four different initial SOCs and at five different temperatures. For each experiment, the battery is initially set at the defined SOC at room temperature, and then rested inside a thermal chamber for an hour under the defined temperature before cycling. The impulse-response method regresses the impedance spectrum in real time, based on the battery terminal current and voltage data.

Figure 14:
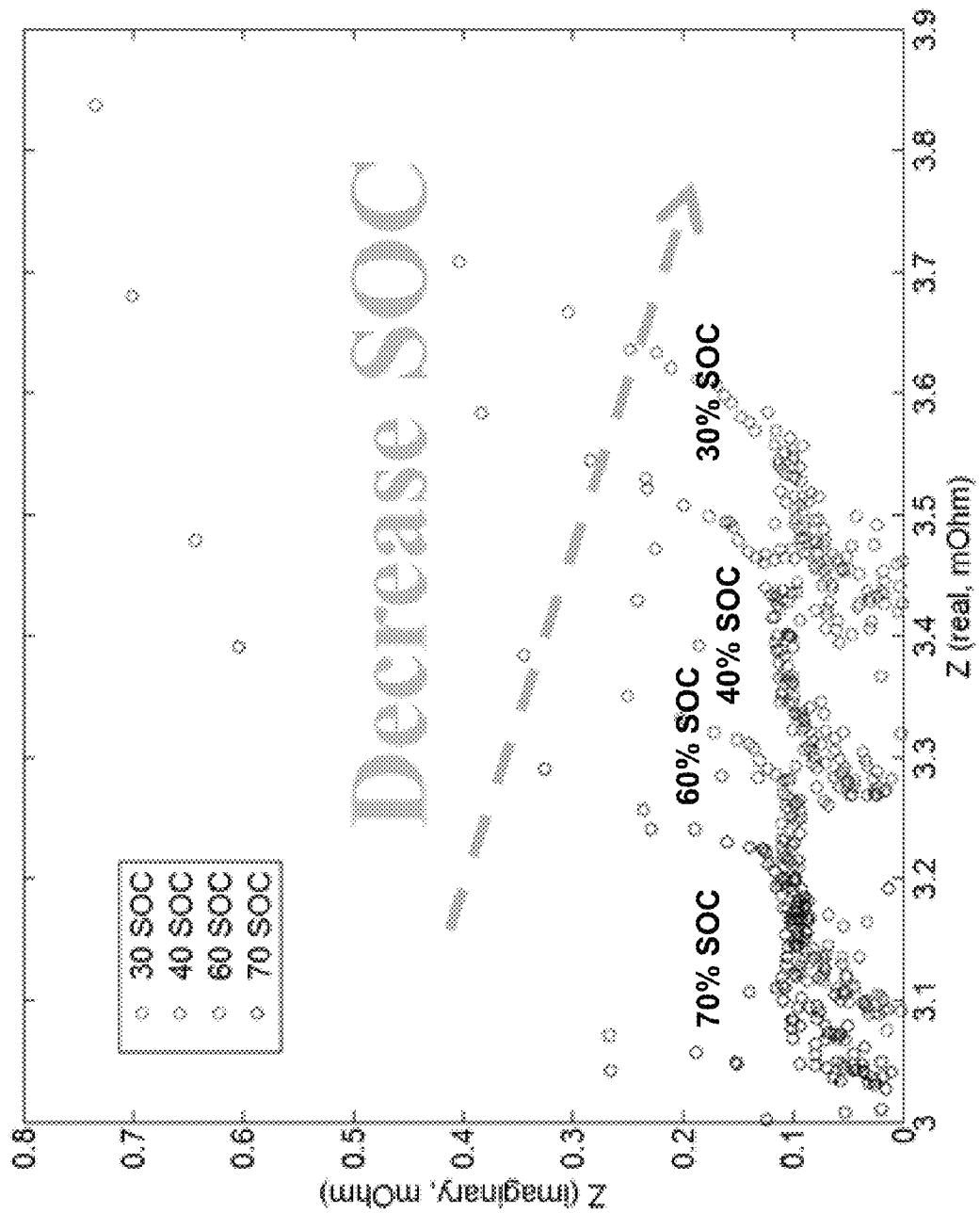
FIG. 14 is a graph of the impedance spectra (Nyquist plots) at four different initial SOCs at 10° C.
Figure 15:
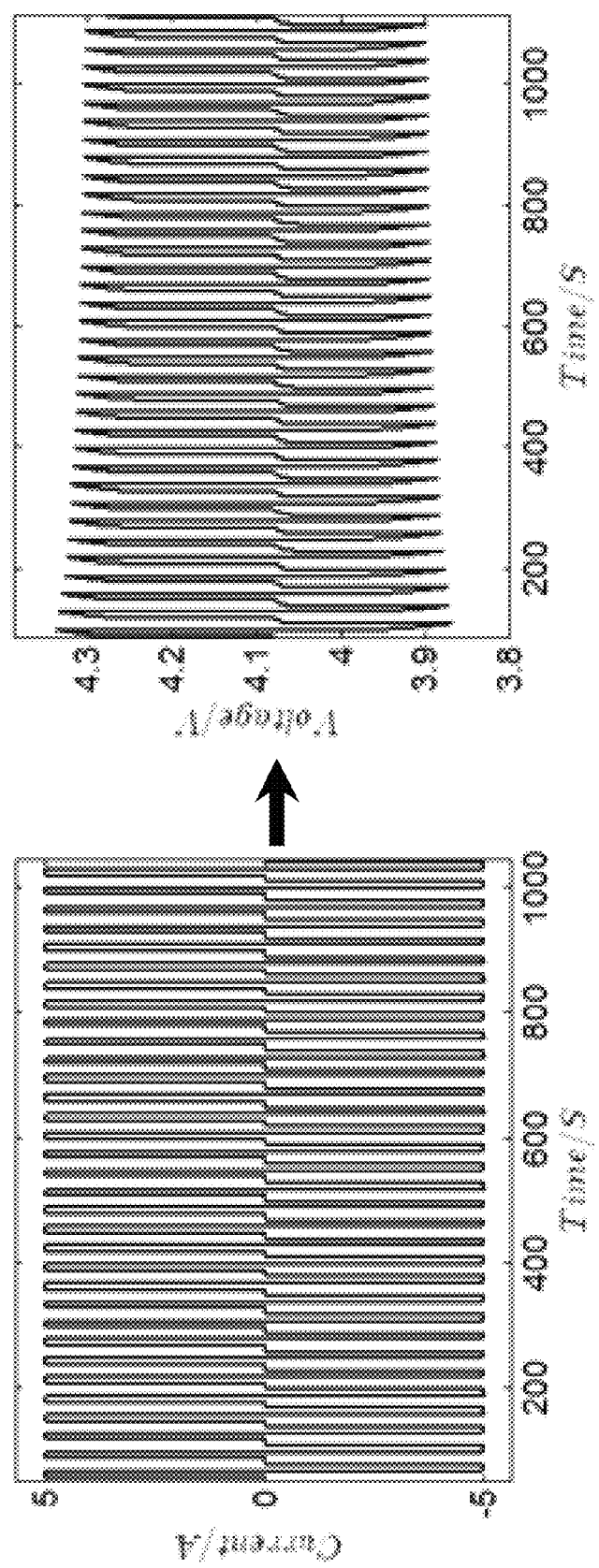
FIG. 15 is an example of a current pulse used to drive a cell (left side of figure) and the measured terminal voltage (right side of FIG. 15), in Example 5.

FIG. 14 depicts the impedance spectra (Nyquist plots) at five different temperatures with the same initial SOC (70%). FIG. 15 depicts the impedance spectra (Nyquist plots) at four different initial SOCs at 10° C.

Example 5

Figure 16:
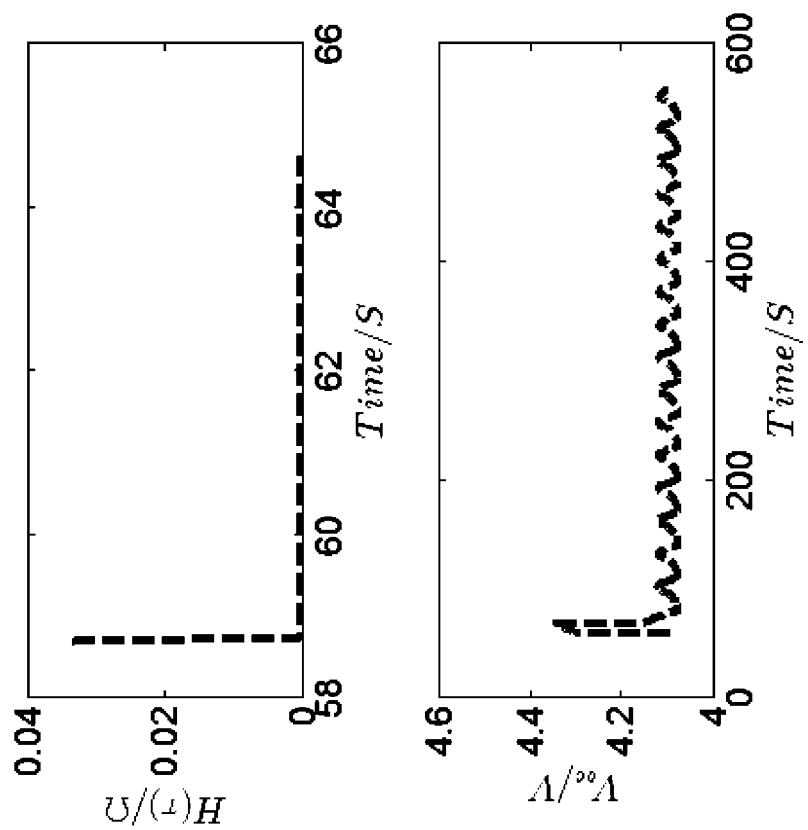
FIG. 16 is a graph of the impulse response function H(t) (upper part) and $V_{oc}$ vs. time (lower part), in Example 5.

Proof-of-Concept Demonstration of Internal Temperature Probing of a Commercial Battery Using the DC Current Pulse Method FIG. 16 is an example of a current pulse used to drive a commercial cell (left side) and the measured terminal voltage (right side of FIG. 16). The cell is a Sanyo 1.5 Ah cell, composed of NiCoMn-based composite, $LiMn_{1/3}Ni_{1/3}Co_{1/3}+LiMn_2O_4$ positive electrode and graphite negative electrode. The current is 4.5C, with a pulse width Δt of 1 s, and a pulse interval T of 10 sec. The battery is initially set at 70% SOC.

Figure 17:
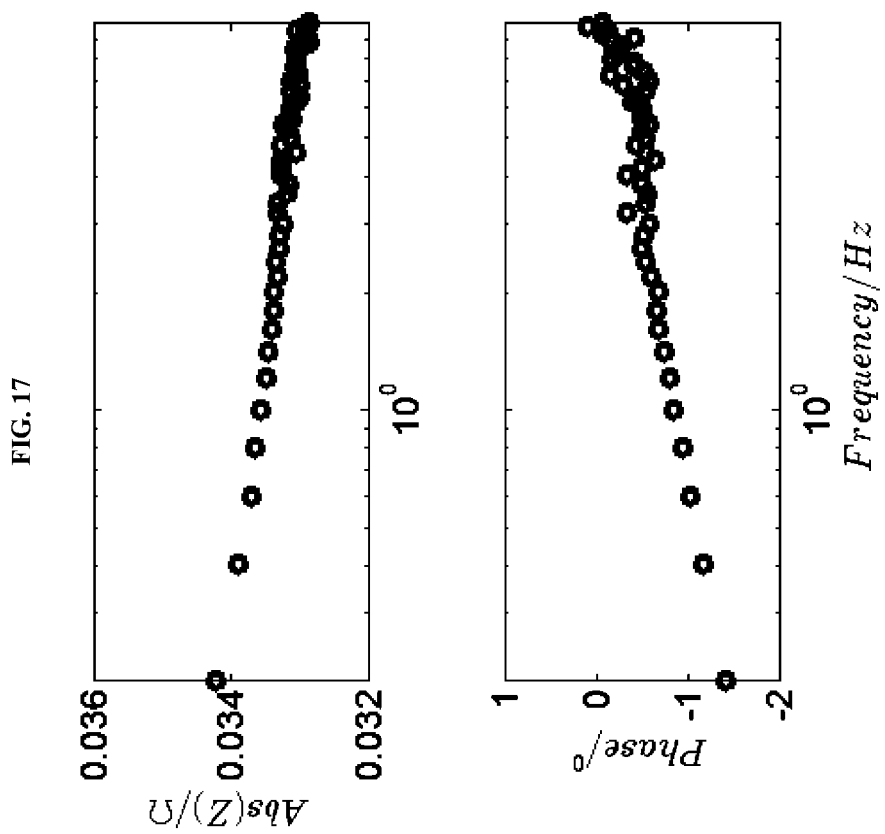
FIG. 17 is a graph of the impedance vs. frequency (top) and the phase vs. frequency (bottom) in Example 5.
Figure 18:
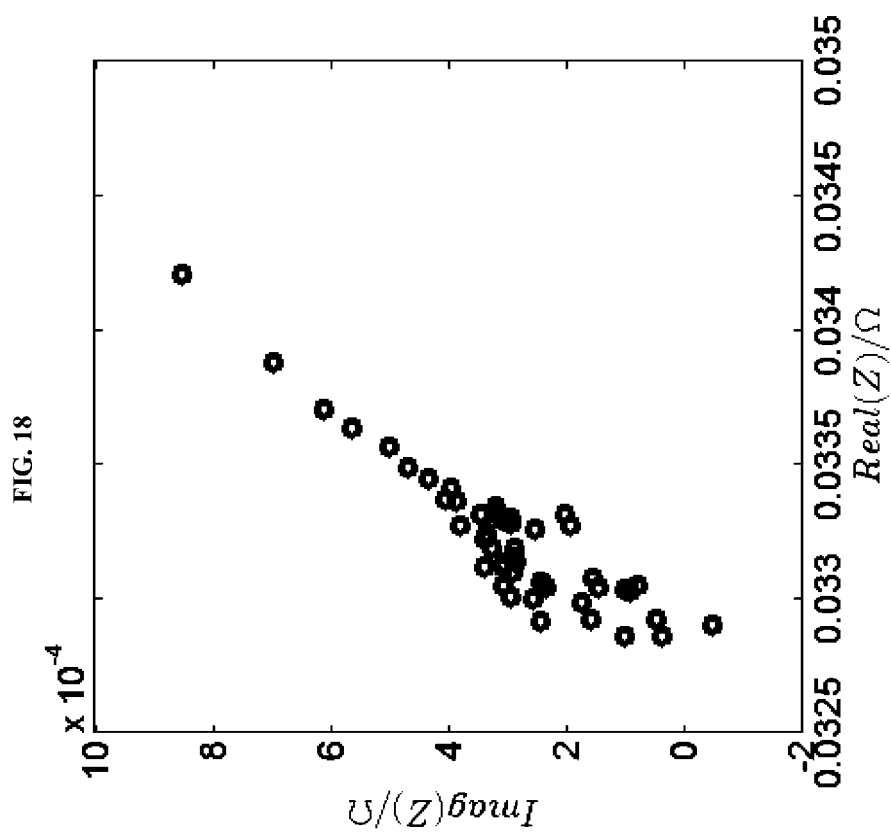
FIG. 18 is a plot of the impedance data in the Nyquist format.

FIGS. 16-18 show a derivation of the impedance spectrum, based on which temperature is referred. The plot in the upper part of FIG. 16 shows the impulse response function H(t), while the plot in the lower part of FIG. 16 shows $V_{oc}$ vs. time. Both are outputs of the impulse response method. Plots in FIG. 17 show the impedance vs. frequency (top), and the phase vs. frequency (bottom). Both are the product of the Fourier transform of H(t). FIG. 18 is a plot of the impedance in the Nyquist format. Using the amplitude of the impedance at 1 Hz (0.0335Ω), and the SOC value (70%), we can easily deduce the temperature of the battery to be about 23° C. from the look-up table plotted in FIG. 11.

There are a wide variety of practical and commercial uses for the present invention. It can be valuable to be able to probe the internal temperature, without any auxiliary devices, of a wide variety of electrochemical systems. This invention has many commercial applications where battery safety and battery management systems are important. Direct sensing of the battery temperature can greatly improve the battery safety and enhance the accuracy and reliability of battery management, especially for automobiles, aircrafts, satellites airplanes, and consumer portable electronics, for example. This also translates to a reduced warranty risk and maintenance costs.

In this detailed description, reference has been made to multiple embodiments and to the accompanying drawings in which are shown by way of illustration specific exemplary embodiments of the invention. These embodiments are described in sufficient detail to enable those skilled in the art to practice the invention, and it is to be understood that modifications to the various disclosed embodiments may be made by a skilled artisan.

Where methods and steps described above indicate certain events occurring in certain order, those of ordinary skill in the art will recognize that the ordering of certain steps may be modified and that such modifications are in accordance with the variations of the invention. Additionally, certain steps may be performed concurrently in a parallel process when possible, as well as performed sequentially.

All publications, patents, and patent applications cited in this specification are herein incorporated by reference in their entirety as if each publication, patent, or patent application were specifically and individually put forth herein.

The embodiments, variations, and figures described above should provide an indication of the utility and versatility of the present invention. Other embodiments that do not provide all of the features and advantages set forth herein may also be utilized, without departing from the spirit and scope of the present invention. Such modifications and variations are considered to be within the scope of the invention defined by the claims.

What is claimed is:

1. A method of estimating the internal temperature of an electrochemical device, said method comprising:
   (a) exciting said electrochemical device with a driving profile;
   (b) acquiring voltage and current data from said electrochemical device, in response to said driving profile;
   (c) calculating an impulse response from said current and voltage data and time derivatives thereof, using a recursive or matrix-based technique;
   (d) calculating an impedance spectrum of said electrochemical device from said impulse response using an impulse response model;
   (e) calculating a state-of-charge of said electrochemical device;
   (f) estimating an internal temperature of said electrochemical device based on a temperature-impedance-state-of-charge relationship characterizing said electrochemical device; and
   (g) managing said electrochemical device by adjusting electrical current and/or voltage to or from said electrochemical device in response to said internal temperature.

2. The method of claim 1, wherein said driving profile includes a plurality of double-pulse sequences, wherein each of said double-pulse sequences comprises a constant-current discharge pulse having a pulse width and a pulse amplitude, a constant-current charge pulse having said pulse width and said pulse amplitude, and a zero-current period.

3. The method of claim 1, wherein step (c) utilizes a Kalman filtering technique.

4. The method of claim 1, wherein said recursive or matrix-based method utilizes a moving window to update time-varying electrical responses.

5. The method of claim 1, wherein said impulse response model is a finite impulse response digital filter or an infinite impulse response digital filter.

6. The method of claim 1, wherein said impedance spectrum in step (d) is calculated in a frequency range of 0.01 Hz to 1000 Hz.

7. The method of claim 6, wherein said frequency range is 0.1 Hz to 1 Hz.

8. The method of claim 1, wherein step (e) comprises calculating the Fourier transform of said impulse response to obtain said state-of-charge.

9. The method of claim 1, wherein step (e) comprises calculating said state-of-charge based on an initial open-circuit voltage and Coulomb counting.

10. The method of claim 1, wherein said temperature-impedance-state-of-charge relationship is in the form of an empirical look-up table or graph that is applicable to said electrochemical device or a theoretical equation correlating impedance with temperature and state-of-charge.

11. The method of claim 1, wherein said method is implemented in a temperature safety device within a temperature range selected from −30° C. to 120° C.

12. The method of claim 1, said method further comprising repeating steps (a)-(g) continually or periodically during operation of said electrochemical device.

13. A temperature-sensing apparatus for estimating the internal temperature of an electrochemical device, wherein said temperature-sensing apparatus is a temperature safety device within a temperature range selected from −30° C. to 120° C., and wherein said apparatus comprises a computer that is electrically linkable to said electrochemical device; said computer programmed using non-transitory memory with executable code for executing the steps of:
   (a) exciting said electrochemical device with a driving profile;
   (b) acquiring voltage and current data from said electrochemical device, in response to said driving profile;
   (c) calculating an impulse response from said current and voltage data and time derivatives thereof, using a recursive or matrix-based technique;
   (d) calculating an impedance spectrum of said electrochemical device from said impulse response using an impulse response model;
   (e) calculating a state-of-charge of said electrochemical device;

(f) estimating an internal temperature of said electrochemical device based on a temperature-impedance-state-of-charge relationship characterizing said electrochemical device; and (g) managing said electrochemical device by adjusting electrical current and/or voltage to or from said electrochemical device in response to said internal temperature.

14. A temperature-monitored electrochemical system comprising said temperature-sensing apparatus of claim 13, wherein said temperature-sensing apparatus is electrically linked to said electrochemical device.

15. The temperature-monitored electrochemical system of claim 14, wherein said electrochemical device is selected from the group consisting of a battery, a fuel cell, an electrolytic cell, a capacitor, a supercapacitor, a pseudocapacitor, an electroplating system, and a galvanic corrosion system.

16. The temperature-monitored electrochemical system of claim 14, wherein said driving profile includes a plurality of double-pulse sequences, wherein each of said double-pulse sequences comprises a constant-current discharge pulse having a pulse width and a pulse amplitude, a constant-current charge pulse having said pulse width and said pulse amplitude, and a zero-current period.

17. The temperature-monitored electrochemical system of claim 14, wherein step (c) utilizes a Kalman filtering technique.

18. The temperature-monitored electrochemical system of claim 14, wherein said recursive or matrix-based technique utilizes a moving window to update time-varying electrical responses.

19. The temperature-monitored electrochemical system of claim 14, wherein said impulse response model is a finite impulse response digital filter or an infinite impulse response digital filter.

20. The temperature-monitored electrochemical system of claim 14, wherein said impedance spectrum in step (d) is estimated in a frequency range of 0.01 Hz to 1000 Hz.

21. The temperature-monitored electrochemical system of claim 20, wherein said frequency range is 0.1 Hz to 1 Hz.

22. The temperature-monitored electrochemical system of claim 14, wherein step (e) comprises calculating the Fourier transform of said impulse response to obtain said state-of-charge.

23. The temperature-monitored electrochemical system of claim 14, wherein step (e) comprises calculating said state-of-charge based on an initial open-circuit voltage and Coulomb counting.

24. The temperature-monitored electrochemical system of claim 14, wherein said temperature-impedance-state-of-charge relationship is in the form of an empirical look-up table or graph that is applicable to said electrochemical device or a theoretical equation correlating impedance with temperature and state-of-charge.

\* \* \* \* \*